(12) United States Patent
Chang et al.

(10) Patent No.: US 12,224,237 B2
(45) Date of Patent: Feb. 11, 2025

(54) METHOD OF MANUFACTURING A VIA AND A METAL WIRING FOR A SEMICONDUCTOR DEVICE

(71) Applicant: TAIWAN SEMICONDUCTOR MANUFACTURING COMPANY, LTD., Hsinchu (TW)

(72) Inventors: Shih-Ming Chang, Hsinchu (TW); Yu-Tse Lai, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 553 days.

(21) Appl. No.: 17/488,271

(22) Filed: Sep. 28, 2021

(65) Prior Publication Data

US 2022/0375852 A1 Nov. 24, 2022

Related U.S. Application Data

(60) Provisional application No. 63/192,347, filed on May 24, 2021.

(51) Int. Cl.
*H01L 23/522* (2006.01)
*H01L 21/311* (2006.01)
(Continued)

(52) U.S. Cl.
CPC .... *H01L 23/5226* (2013.01); *H01L 21/31144* (2013.01); *H01L 21/32139* (2013.01);
(Continued)

(58) Field of Classification Search
CPC ......... H01L 21/31144; H01L 21/32139; H01L 21/76816; H01L 21/76895; H01L 23/5226; H01L 23/53209
(Continued)

(56) References Cited

U.S. PATENT DOCUMENTS 7,163,886 B2 * 1/2007 Fujiwara ......... H01L 21/823828
257/E21.507
7,785,113 B2 8/2010 Mizoguchi
(Continued)

FOREIGN PATENT DOCUMENTS

CN 101273494 A 9/2008
KR 1020050002953 A 1/2005
(Continued)

*Primary Examiner* — Hoai V Pham
(74) *Attorney, Agent, or Firm* — STUDEBAKER & BRACKETT PC

(57) ABSTRACT

In a method of manufacturing a semiconductor device, a first conductive layer is formed over a first interlayer dielectric (ILD) layer disposed over a substrate, a second ILD layer is formed over the first conductive layer, a via is formed in the second ILD layer to contact an upper surface of the first conductive layer, a hard mask pattern is formed over the second ILD layer, the second ILD layer and the first conductive layer are patterned by using the hard mask pattern as an etching mask, thereby forming patterned second ILD layers and first wiring patterns, after the patterning, the hard mask pattern is removed, and a third ILD layer is formed between the patterned second ILD layers and the first wiring patterns.

20 Claims, 24 Drawing Sheets

(51) Int. Cl.
  *H01L 21/3213* (2006.01)
  *H01L 21/768* (2006.01)
  *H01L 23/532* (2006.01)

(52) U.S. Cl.
  CPC .. *H01L 21/76816* (2013.01); *H01L 21/76895* (2013.01); *H01L 23/53209* (2013.01)

(58) Field of Classification Search
  USPC ........................................................ 438/622
  See application file for complete search history.

(56) References Cited

U.S. PATENT DOCUMENTS

| | | |
|---|---|---|
| 8,946,906 B2 | 2/2015 | Maeda |
| 2001/0023128 A1 | 9/2001 | Ueda et al. |
| 2003/0003741 A1 | 1/2003 | Ueda et al. |
| 2004/0266178 A1 | 12/2004 | Kim |
| 2012/0153463 A1 | 6/2012 | Maeda |
| 2015/0342045 A1 | 11/2015 | Nakabayashi et al. |
| 2018/0061765 A1 | 3/2018 | Gozu et al. |

FOREIGN PATENT DOCUMENTS

| | | | |
|---|---|---|---|
| KR | 10-2014-1475109 B1 | 12/2014 | |
| TW | I482542 B | 4/2015 | |

\* cited by examiner

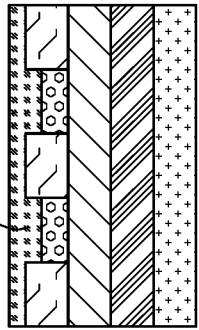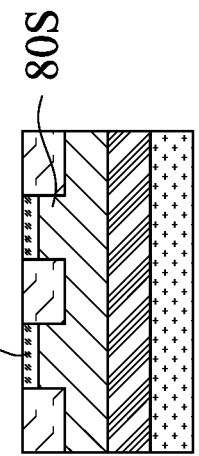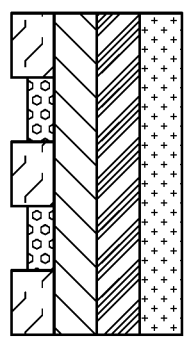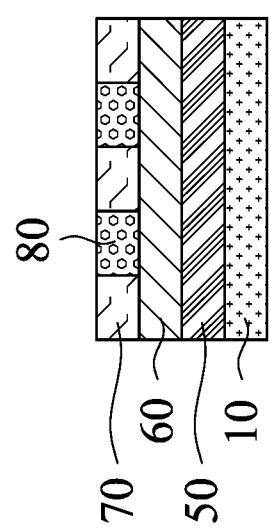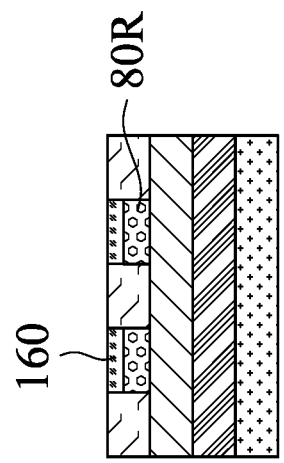

METHOD OF MANUFACTURING A VIA AND A METAL WIRING FOR A SEMICONDUCTOR DEVICE

RELATED APPLICATIONS

This application claims the priority of U.S. Provisional Application No. 63/192,347 filed on May 24, 2021, the entire contents of which application are incorporated herein by reference.

BACKGROUND

Semiconductor devices (integrated circuits) include multiple wiring layers having wiring patterns and vias connecting vertically adjacent wiring patterns to achieve complex circuitry functions. In forming a via and a metal wiring during semiconductor device fabrication, improved overlay control is desired. A damascene process, in particular, a dual damascene process, is widely used to form a via and a metal wiring. However, further improvement in the wiring layer formation process is still required to fabricate advanced semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 17A, 17B, 17C, 17D and 17E show views of the various stages of a sequential manufacturing operation of a semiconductor device in accordance with embodiments of the present disclosure.

DETAILED DESCRIPTION

Figure 1:
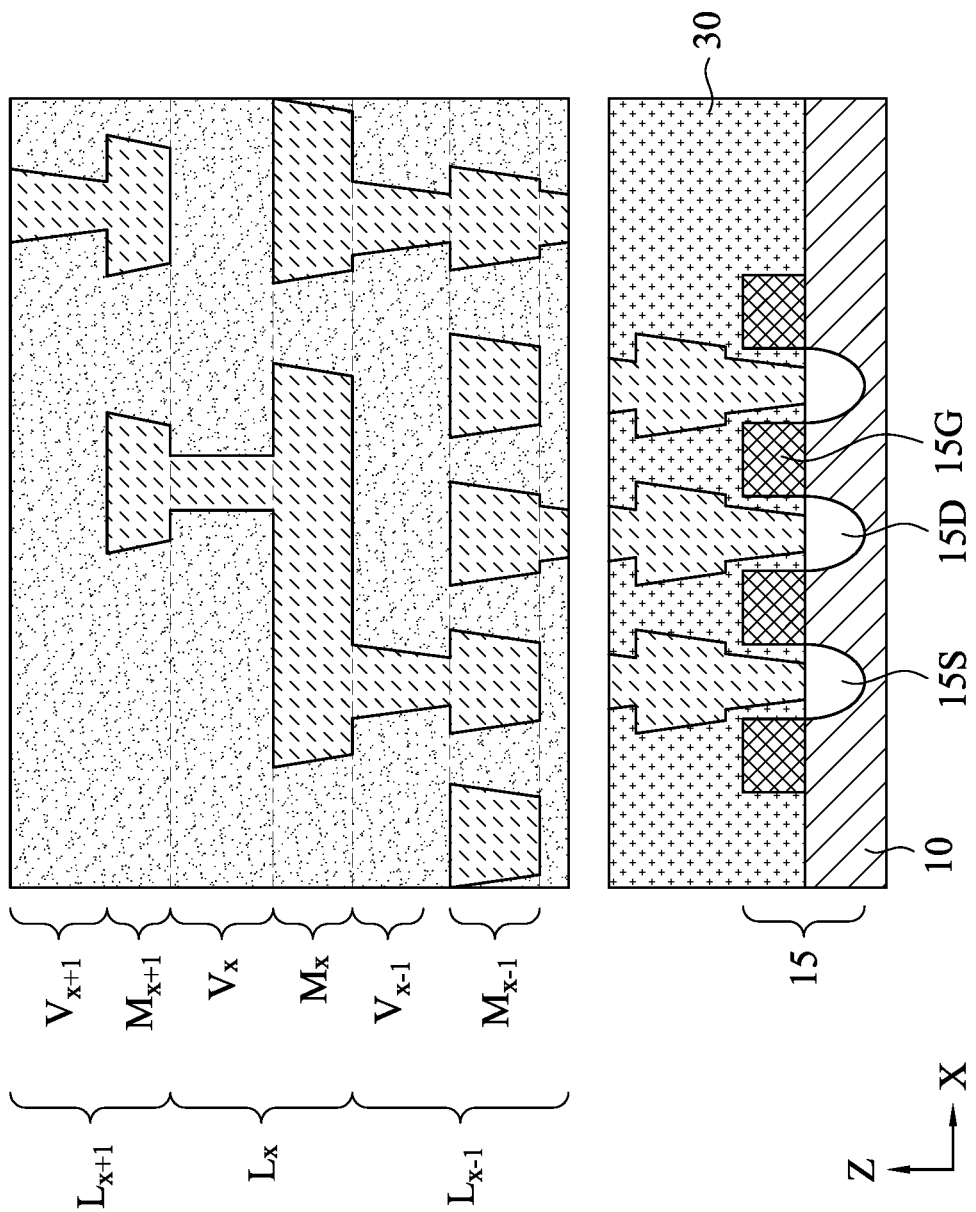
FIG. 1 is a cross sectional view of a semiconductor device in accordance with embodiments of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of" Further, in the following fabrication process, there may be one or more additional operations in/between the described operations, and the order of operations may be changed.

In the back-end-of-line (BEOL) process for forming metal wiring layers, a dual damascene process is used, in which trenches for metal lines (conductive wiring patterns) and holes for vias are fabricated, and then the trenches and the holes are filled with conductive material at the same time. In the dual damascene process, a via and a metal wiring pattern disposed over the via (i.e., the metal wiring layer is upper than the via) are formed at the same time. When the critical dimensions (CDs) of the trenches and/or the holes become smaller, it is more difficult to fill the conductive material into very narrow trenches and holes. Further, an overlay error between the via and the metal layer (formed over the via) in the dual damascene process may cause a high electrical resistance or an electrical short circuit. The via overlay error may also induce a smaller space between the metal wiring patterns on the same level, which may increase the risk of an electrical short circuit. In addition, the via overlay error combined with over-etching during formation of the hole for via may induce a cross layer tunnel and cause an electrical short circuit.

In the present disclosure, a novel process to form metal wiring patterns and vias by using a metal etching process, which can reduce an overlay error is provided. In particular, the present embodiments provide a self-aligned process between a via and a metal wiring pattern disposed below the via. More specifically, the vias are formed by a metal filling process, such as a damascene process, or an etching process; and the metal wiring patterns are formed by an etching process using an etching mask.

FIG. 1 is a cross sectional view of a semiconductor device including multiple wiring layers in accordance with embodiments of the present disclosure.

In some embodiments, transistors 15, such as field effect transistors (FETs), are disposed over a substrate 10. In some embodiments, the FET 15 includes a gate electrode 15G, a source 15S and a drain 15D. In the present disclosure, a source and a drain are interchangeably used and may have the same structure. In some embodiments, the FET is a planar FET, a fin FET (Fin FET) or a gate-all-around (GAA) FET. In some embodiments, one or more interlayer dielectric (ILD) layers 30 are formed over the FETs.

In some embodiments, the substrate 10 may be made of a suitable elemental semiconductor, such as silicon, diamond or germanium; a suitable alloy or compound semiconductor, such as Group-IV compound semiconductors (e.g., silicon germanium (SiGe), silicon carbide (SiC), silicon germanium carbide (SiGeC), GeSn, SiSn, SiGeSn), Group III-V compound semiconductors (e.g., gallium arsenide, indium gallium arsenide (InGaAs), indium arsenide, indium phosphide, indium antimonide, gallium arsenic phosphide, or gallium indium phosphide), or the like. The substrate 10 includes isolation regions in some embodiments, such as a shallow trench isolation (STI), located between active regions and separating one or more electronic elements from other electronic elements.

In some embodiments, multiple wiring layers $L_x$ (x-th wiring layer) are formed over the FETs, where x is 1, 2, 3, . . . , as shown in FIG. 1. Each of the wiring layers $L_x$ includes conductive wiring pattern $M_x$ and vias $V_x$ (via contacts) connected above the wiring patterns $M_x$, and each of the wiring layers $L_{x+1}$ ((x+1)-th wiring layer) includes conductive wiring pattern $M_{x+1}$ and vias $V_{x+1}$ connected above the wiring patterns $M_{x+1}$. Similarly, the wiring layers $L_{x-1}$ includes conductive wiring pattern $M_{x-1}$ and vias $V_{x-1}$ connected above the wiring patterns $M_{x-1}$.

In some embodiments, when the wiring layers $L_x$ include wiring patterns $M_x$ extending in the X direction, the wiring layers $L_{x+1}$ include wiring patterns $M_{x+1}$ extending in the Y direction. In other words, X-direction metal wiring patterns and Y-direction metal wiring patterns are alternately stacked in the vertical direction. In some embodiments, x is up to 20. In some embodiments, the wiring layer Li can include the closest wiring patterns $M_1$ to the FETs 15 except for local interconnects. Each of the wiring layers $L_x$ also includes one or more ILD layers or inter-metal dielectric (IMD) layers. In other embodiments, the wiring layer can include vias formed above the metal wiring patterns.

FIGS. 2A and 2B to FIGS. 9A and 9B show various views of the various stages of a sequential manufacturing operation of a semiconductor device in accordance with embodiments of the present disclosure. It is understood that additional operations can be provided before, during, and after processes shown by FIGS. 2A-9B, and some of the operations described below can be replaced or eliminated, for additional embodiments of the method. The order of the operations/processes may be interchangeable. In FIGS. 2A-9B, the "A" figures are perspective views and the "B" figures are cross sectional views along line X1-X1 of FIG. 3A.

Figure 2B:
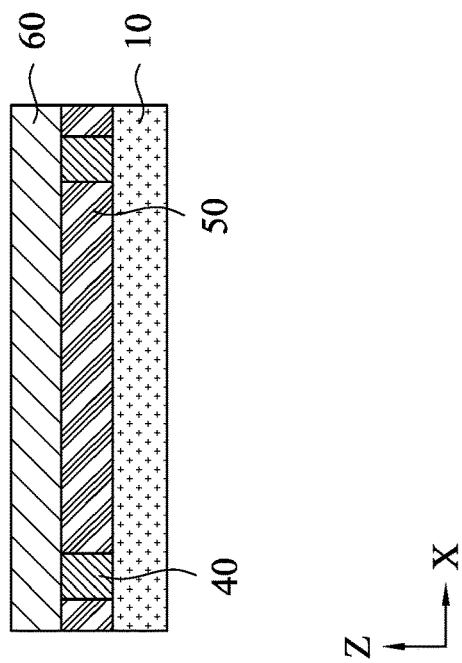
FIGS. 2A and 2B show views of the various stages of a sequential manufacturing operation of a semiconductor device in accordance with embodiments of the present disclosure.
Figure 2A:
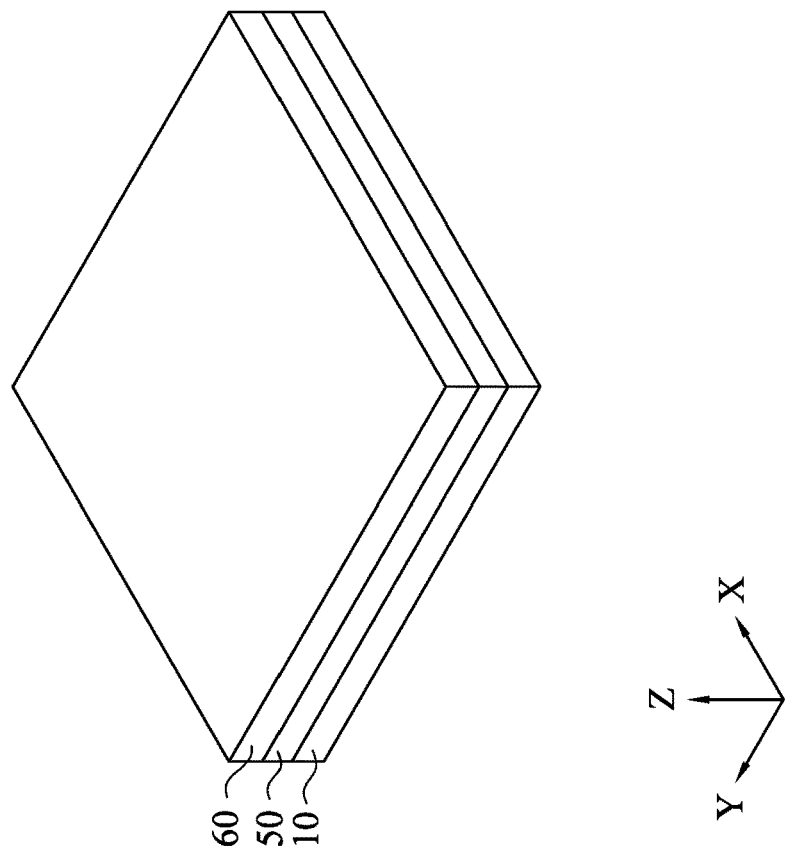

As shown in FIGS. 2A and 2B, a first conductive layer 60, as a blanket layer, is formed over a first dielectric (ILD) layer 50 disposed over the substrate 10. The first dielectric layer 50 includes one or more dielectric layers disposed over the FETs (not shown in FIGS. 2A and 2B) and include lower vias (via contacts) 40. The lower vias 40 correspond to, for example, the vias $V_{x-1}$ shown in FIG. 1 in some embodiments, or local interconnects directly disposed on the source and/or drain of the FETs.

In some embodiments, the first conductive layer 60 includes one or more layers of conductive material, such as Cu, Al, Ru, W, Co, Ti or Ta or an alloy thereof. In some embodiments, the thickness of the first conductive layer 60 is in a range from about 20 nm to about 200 nm. When the first conductive layer is made of a single metal element, the purity of the metal element is more than 99% in some embodiments. In some embodiments, the purity is less than 100% and the first conductive layer may include an impurity, such as carbon. In some embodiments, Ru, Co or Cu is used. In some embodiments, the first conductive layer 60 is formed by chemical vapor deposition (CVD), physical vapor deposition (PVD) including sputtering, plating or atomic layer deposition (ALD).

In some embodiments, the first ILD layer 50 includes one or more layers of silicon oxide, SiON, SiOCN, SiCN, SiOC, silicon nitride, an organic material, a low-k dielectric material, or an extreme low-k dielectric material.

Figure 3B:
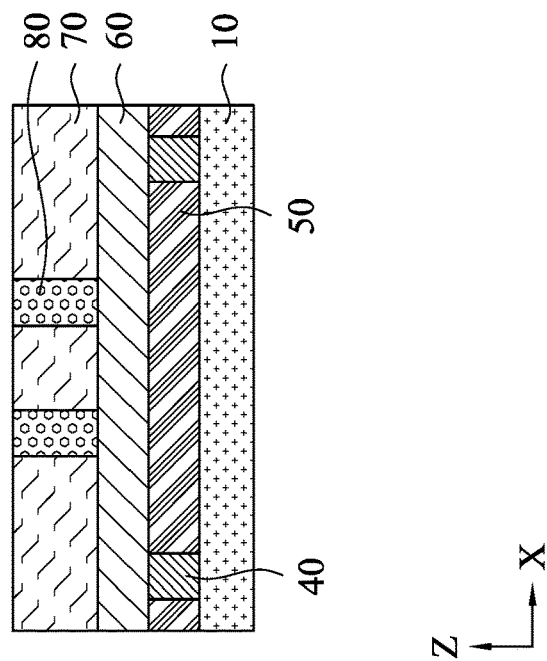
FIGS. 3A and 3B show views of the various stages of a sequential manufacturing operation of a semiconductor device in accordance with embodiments of the present disclosure.
Figure 3A:
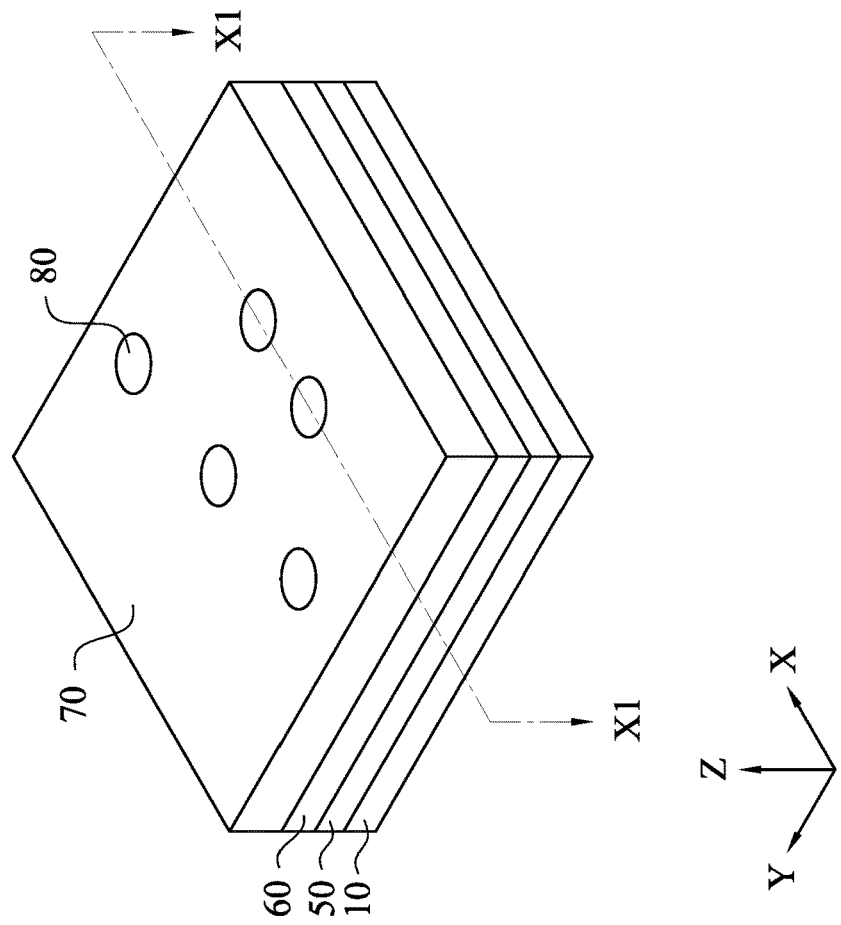

Next, as shown in FIGS. 3A and 3B, a second ILD layer 70 is formed over the first conductive layer 60. In some embodiments, the second ILD layer 70 is made of the same material as or different material from the first ILD layer 50, and includes one or more layers of silicon oxide, SiON, SiOCN, SiCN, SiOC, silicon nitride, an organic material, a low-k dielectric material, or an extreme low-k dielectric material. In some embodiments, the thickness of the second ILD layer 70 is in a range from about 20 nm to about 200 nm.

Then, as shown in FIGS. 3A and 3B, one or more first vias (via contact) 80 are formed in the second ILD layer 70. In some embodiments, the first vias 80 correspond to the vias $V_x$.

In some embodiments, a single damascene process is employed to form the first vias 80. In the single damascene process, a resist pattern having holes corresponding to the vias 80 is formed over the second ILD layer 70 and the second ILD layer 70 is patterned by using plasma etching to form holes in the second ILD layer 70. Then, one or more conductive layers are formed in the holes (a filling process) and over the upper surface of the second ILD layer 70, and one or more planarization operation, such as a chemical mechanical polishing (CMP) process, is performed to remove excess portions of the conductive layers.

In some embodiments, the first vias 80 include one or more layers of a conductive material, such as Cu, Al, Ru, W, Co, Ti or Ta or an alloy thereof. In some embodiments, the first vias 80 includes one or more barrier or adhesion layers (e.g., Ti, TiN, Ta and/or TaN) and one or more body layers (e.g., Cu, Ru, Co, etc.). In some embodiments, the first vias 80, in particular, the body layer, is made of the same material as or different material from the first conductive layer 60. In some embodiments, the first conductive layer 60 includes Ru and the first vias 80 include Cu. In some embodiments, the first vias 80 include a body layer and a cap layer disposed on the body layer. In some embodiments, the cap layer is made of the same material as or a different material than a hard mask layer explained in FIGS. 4A and 4B. When the via, in particular, the body layer, is made of a single metal element, the purity of the metal element is more than 99% in some embodiments. In some embodiments, the purity is less than 100% and the material may include an impurity, such as carbon.

Figure 4B:
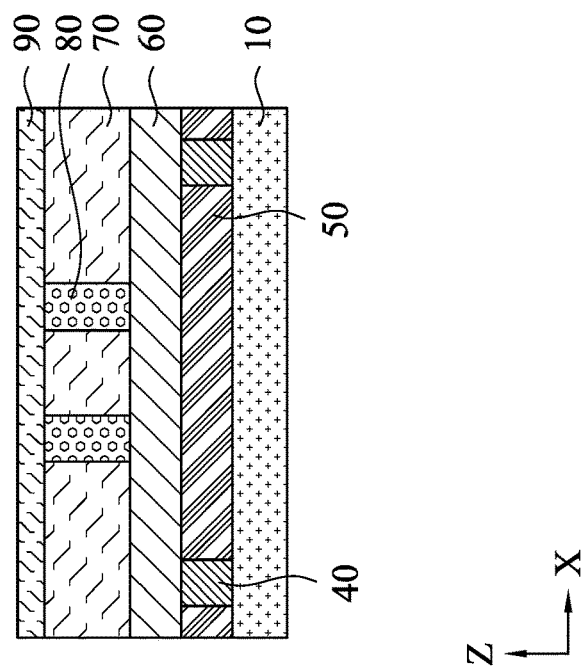
FIGS. 4A and 4B show views of the various stages of a sequential manufacturing operation of a semiconductor device in accordance with embodiments of the present disclosure.
Figure 4A:
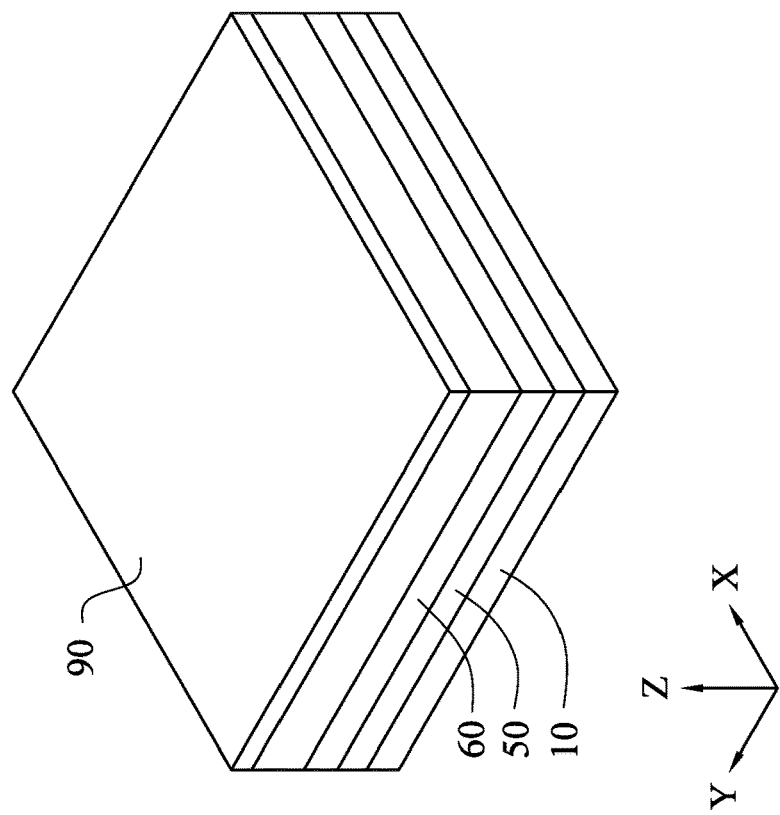

Then, as shown in FIGS. 4A and 4B, a hard mask layer 90 is formed over the second ILD layer 70 and the first vias 80. In some embodiments, the hard mask layer 90 includes one or more dielectric materials (e.g., silicon nitride, aluminum oxide, hafnium oxide, zirconium oxide, etc) different from the second ILD layer 70 or one or more metal or metal nitride layers, such as Ta, Ti, TaN or TiN. In some embodiments, TiN is used. In some embodiments, the hard mask layer 90 is formed by CVD, PVD or ALD. In some embodiments, the thickness of the hard mask layer 90 is in a range from about 5 nm to about 100 nm, depending on the process requirements. In some embodiments, one or more additional ILD layers are formed before forming the hard mask layer 90.

Figure 5B:
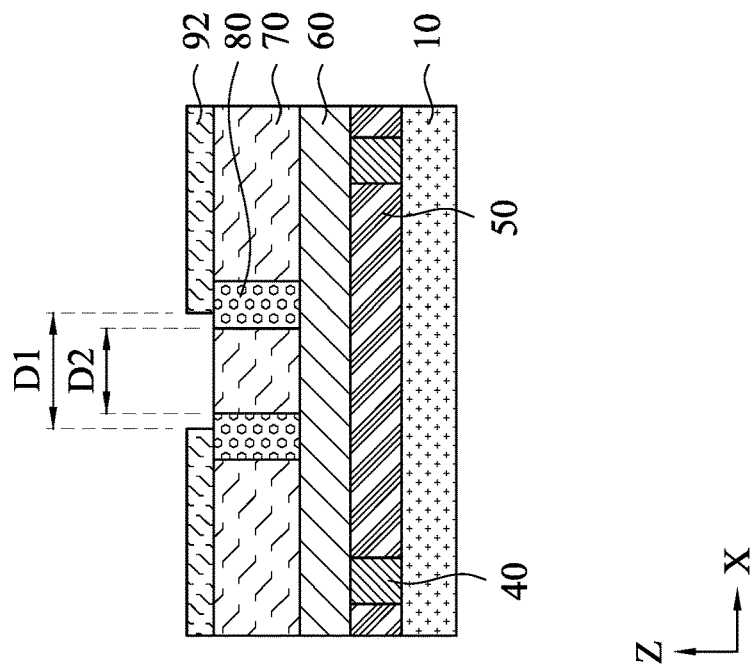
FIGS. 5A, 5B, 5C and 5D show views of the various stages of a sequential manufacturing operation of a semiconductor device in accordance with embodiments of the present disclosure.
Figure 5A:
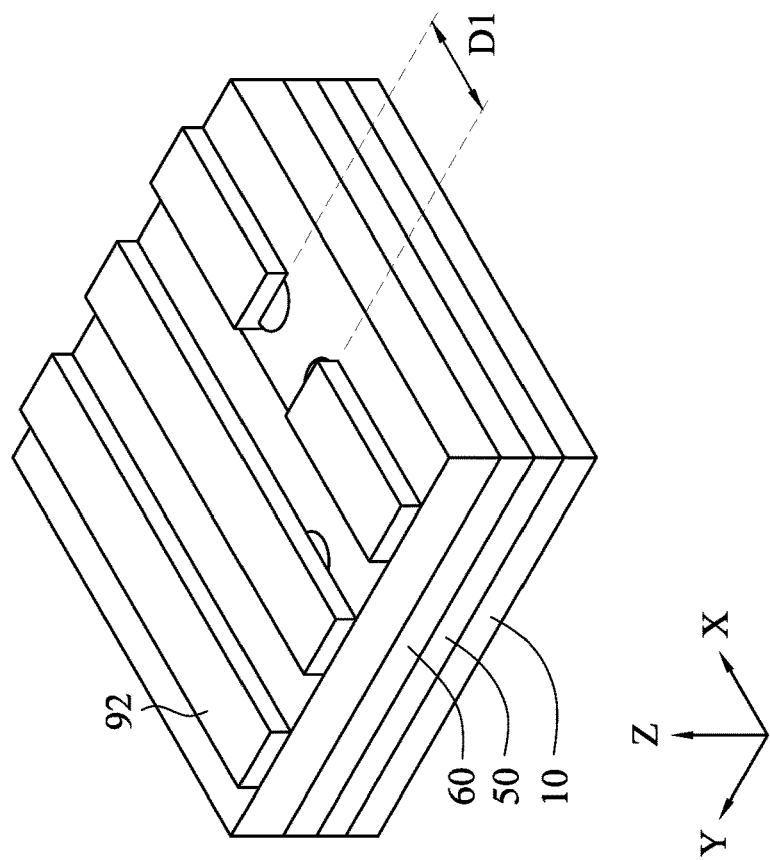

Further, as shown in FIGS. 5A and 5B, by using one or more lithography and etching operations, the hard mask layer 90 is patterned into a hard mask pattern 92. In some embodiments, the hard mask pattern 92 corresponds to the wiring patterns $M_x$ of FIG. 1. The hard mask pattern 92 is designed to align with the lower vias 40.

In other embodiments, the hard mask pattern 92 is formed by using a single damascene process. In such a case, as shown in FIG. 5C, a resist pattern having trench openings corresponding to the hard mask pattern 92 is formed over an additional ILD layer 71 formed on the second ILD layer 70, the additional ILD layer 71 is patterned by using plasma etching to form trenches in the additional ILD layer 71, one or more hard mask materials are formed in the trenches holes and the upper surface of the additional ILD layer 71, and then a CMP process is performed. In some embodiments, the additional ILD layer 71 is made of the same material as or a similar material to the second ILD layer 70. In other embodiments, no additional ILD layer is formed and the trenches are formed in the second ILD layer 70 and filled by the material for the hard mask pattern, as shown in FIG. 5D.

As shown in FIGS. 5A and 5B, the hard mask pattern 92 does not necessarily fully cover part of the vias 80. In some embodiments, two patterns are adjacent to each other along the X direction (pattern extending direction) with an end-to-end space D1. In some embodiments, the space D1 is smaller than an end-to-end space D2 between adjacent vias 80 along the X direction. In some embodiments, the space D1 is equal or greater than to the space D2 in a layout pattern (layout design).

Figure 6B:
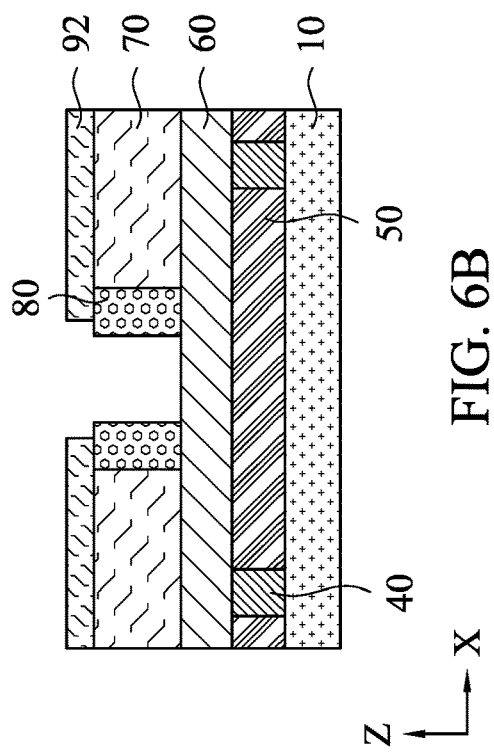
FIGS. 6A, 6B and 6C show views of the various stages of a sequential manufacturing operation of a semiconductor device in accordance with embodiments of the present disclosure.
Figure 6C:
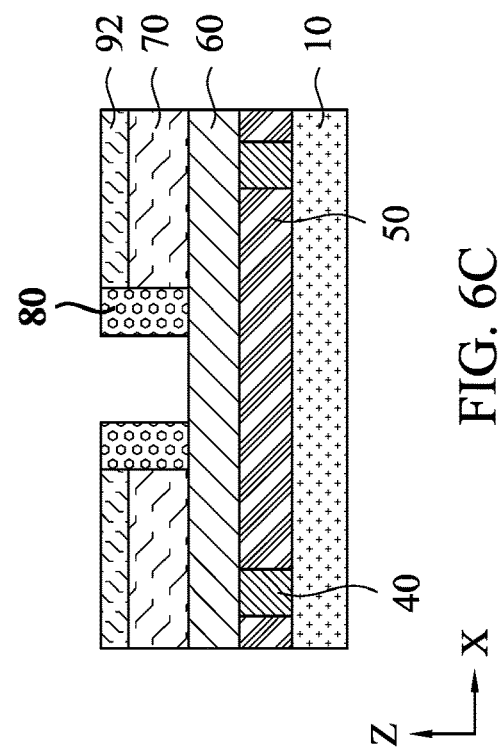
Figure 6A:
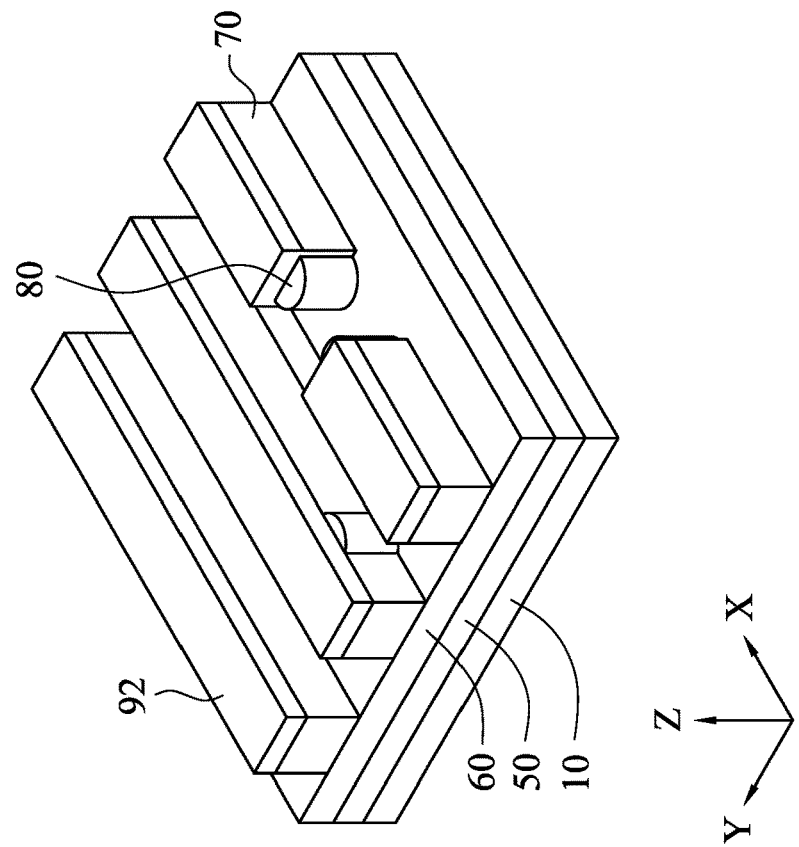

Next, the second ILD layer 70 is patterned by one or more etching operations using the hard mask pattern 92 as an etching mask as shown in FIGS. 6A and 6B. In some embodiments, a plasma etching process is employed. The etching gas in the plasma etching includes one or more selected from the group consisting of carbon tetrafluoride ($CF_4$), difluoromethane ($CH_2F_2$), trifluoromethane ($CHF_3$), and octafluorocyclobutane ($C_4F_8$) or any proper reactants. In some embodiments, carbon dioxide ($CO_2$) is further added to the plasma source gas. Other suitable etching gases may be used. In some embodiments, part of the vias 80 not fully covered by the hard mask pattern 92 also functions as the etching mask. The plasma dry etching substantially stops on the first conductive layer 60.

Figure 5D:
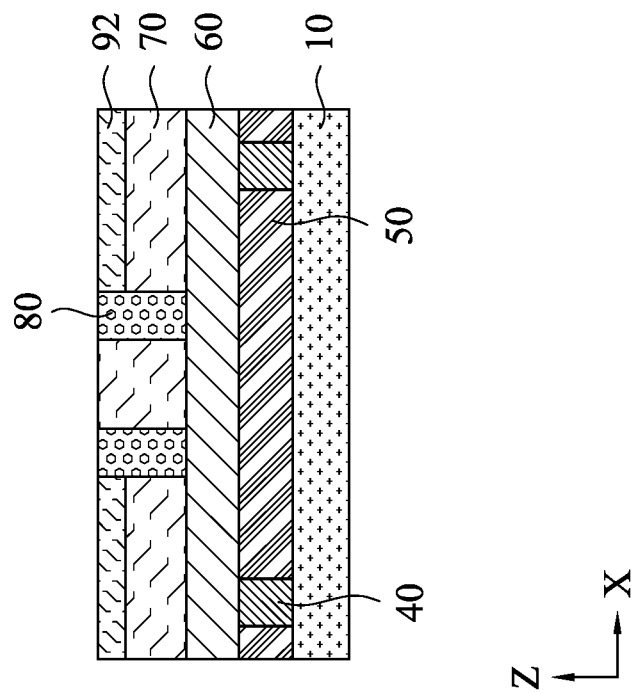
Figure 5C:
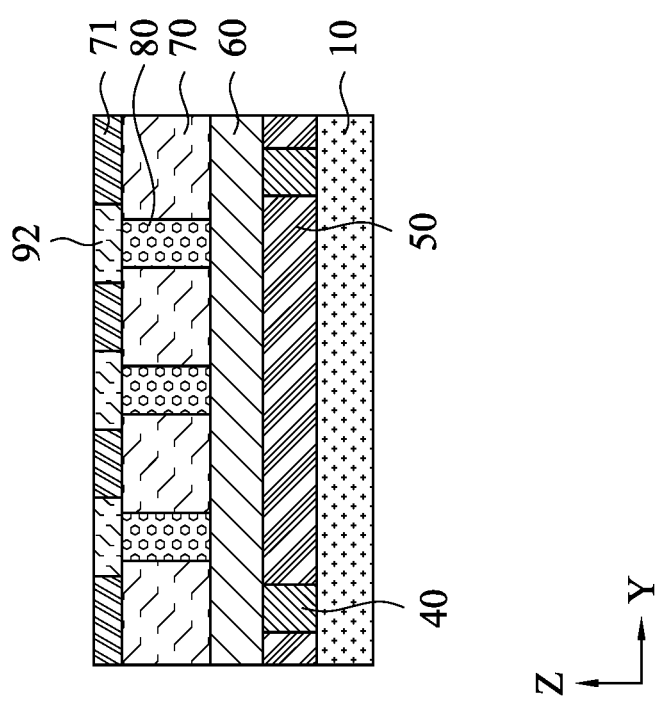

FIG. 6C shows a cross sectional view after the second ILD layer 70 is patterned in case of the structure shown in FIG. 5D.

Figure 7B:
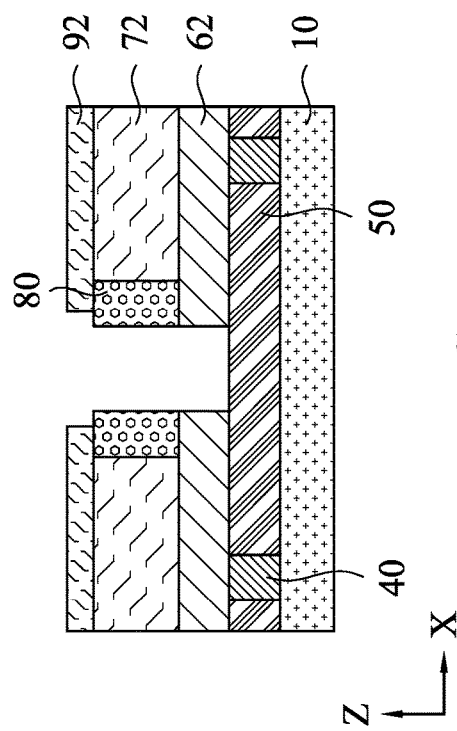
FIGS. 7A, 7B and 7C show views of the various stages of a sequential manufacturing operation of a semiconductor device in accordance with embodiments of the present disclosure.
Figure 7C:
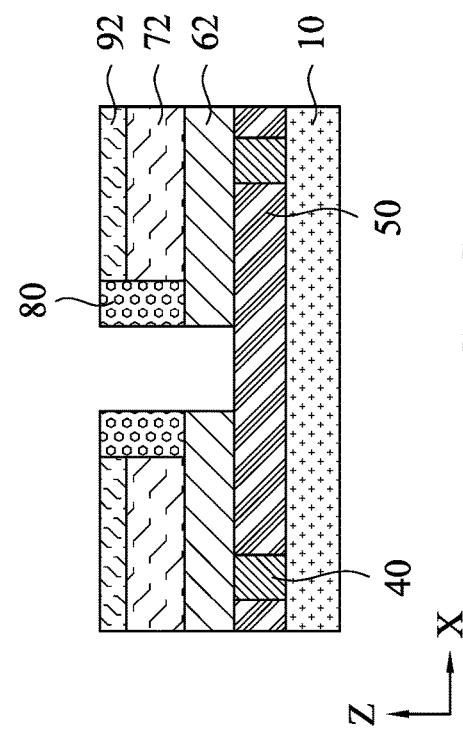
Figure 7A:
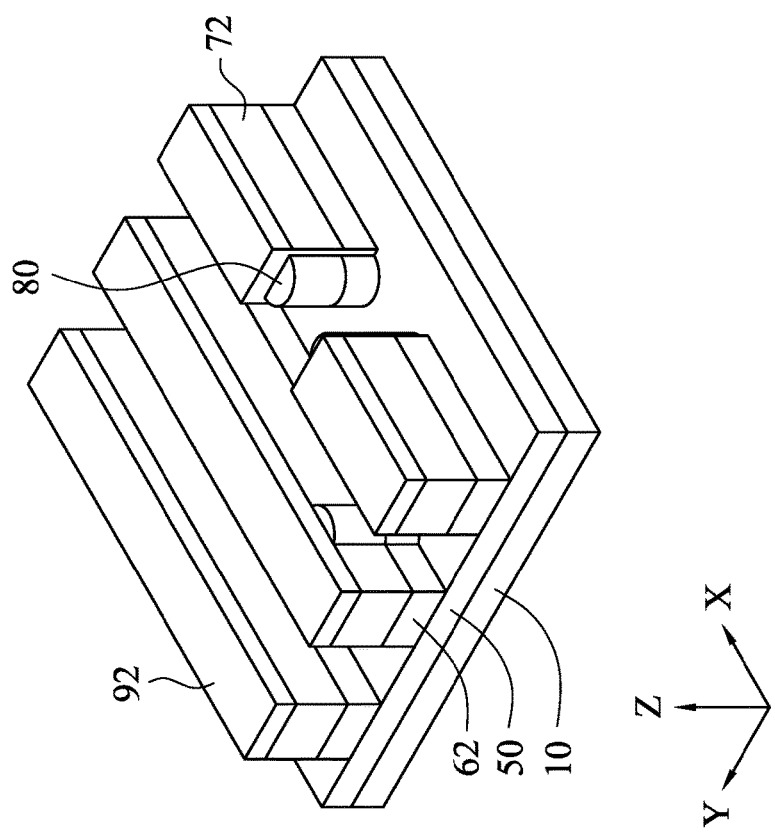

Then, as shown in FIGS. 7A and 7B, the first conductive layer 60 is patterned by one or more etching operations using the hard mask pattern 92, the vias 80 and the patterned second dielectric layer 72 as an etching mask. In some embodiments, a part of the upper surface of the vias 80 is exposed to the plasma (not covered by the hard mask pattern 92). By this etching operation, the metal wiring patterns 62 corresponding to the wiring pattern $M_x$ of FIG. 1 are formed. In some embodiments, the etching gas in the plasma etching includes $Cl_2$ and/or $O_2$, or any other suitable etching gas. The plasma dry etching substantially stops on the first ILD layer 50. FIG. 7C shows a cross sectional view after the first conductive layer 60 is patterned in case of the structure shown in FIGS. 5D and 6C.

As shown in FIGS. 7A and 7B, when a via 80 is disposed at a line end of the wiring pattern 62 along the X direction, the line end of the wiring pattern 62 is confined by the via 80 rather than the line end of the hard mask pattern 92. Similarly, when a via is laterally mis-aligned with the hard mask pattern 92 (i.e. overlay error between the hard mask pattern and the via), for example, when a part of the via 80 protrudes from the side of the hard mask pattern 92 along the Y direction in plan view, the side of the wiring pattern 62 after the etching of the first conductive layer 60 is confined by the via 80 rather than the side of the hard mask pattern 92. In other words, the wiring patterns 62 are formed in a self-aligned manner with respect to the vias 80, which are formed before the wiring patterns 62 are formed (patterned). Thus, in some embodiments, a protrusion 65 is formed at the side of the wiring pattern 62 just below the via 80, which is mis-aligned. In some embodiments, the mis-alignment means that the center of the via does not match (or shifts from) the center of the wiring pattern in the width (short side) direction, in plan view.

Figure 8B:
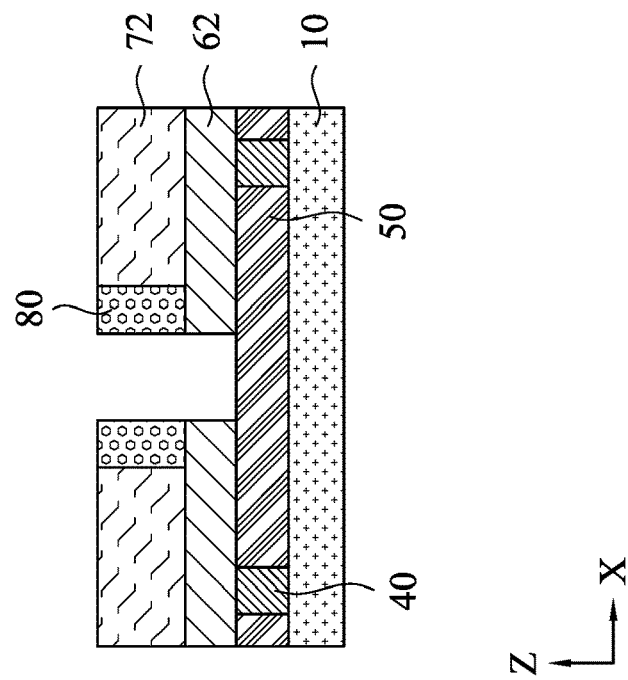
FIGS. 8A, 8B, 8C, 8D, 8E, 8F and 8G show views of the various stages of a sequential manufacturing operation of a semiconductor device in accordance with embodiments of the present disclosure.
Figure 8A:
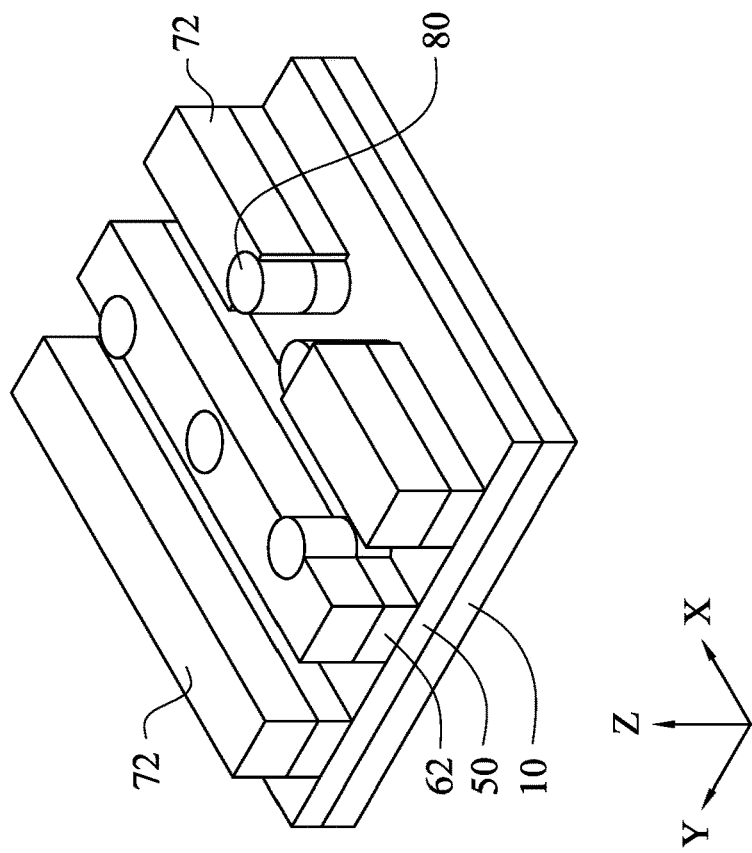
Figure 8D:
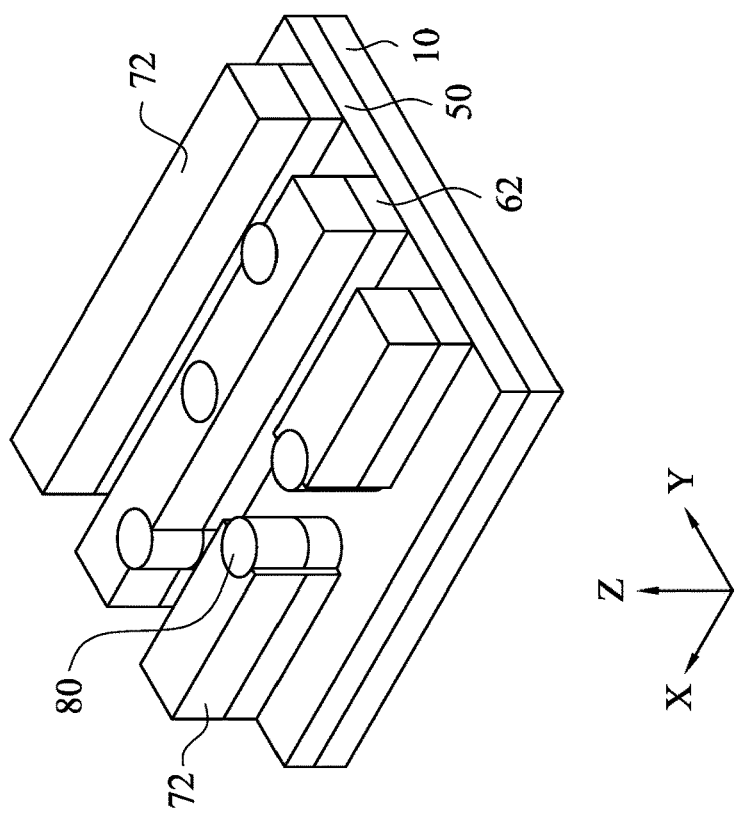
Figure 8C:
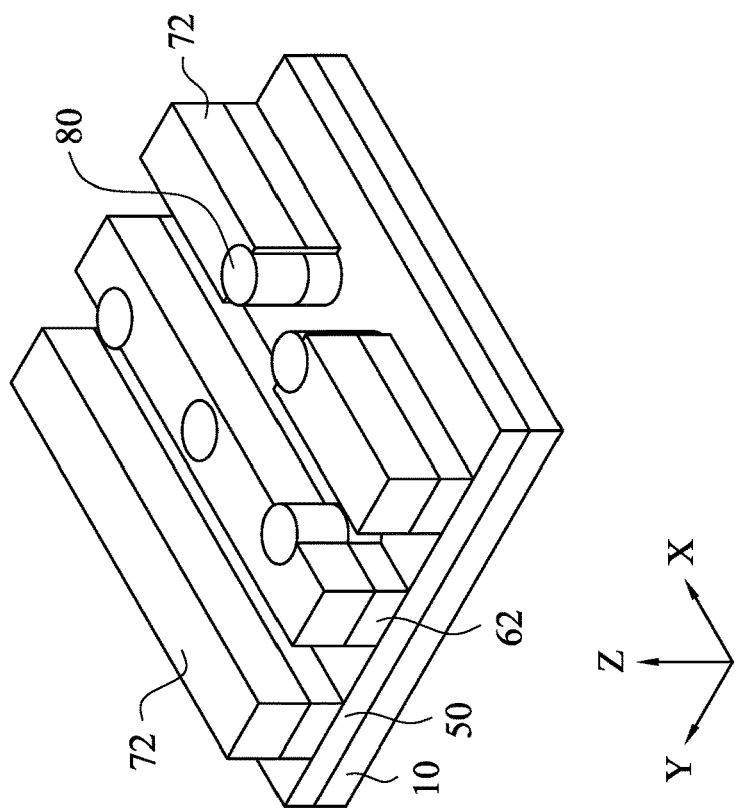
Figure 8F:
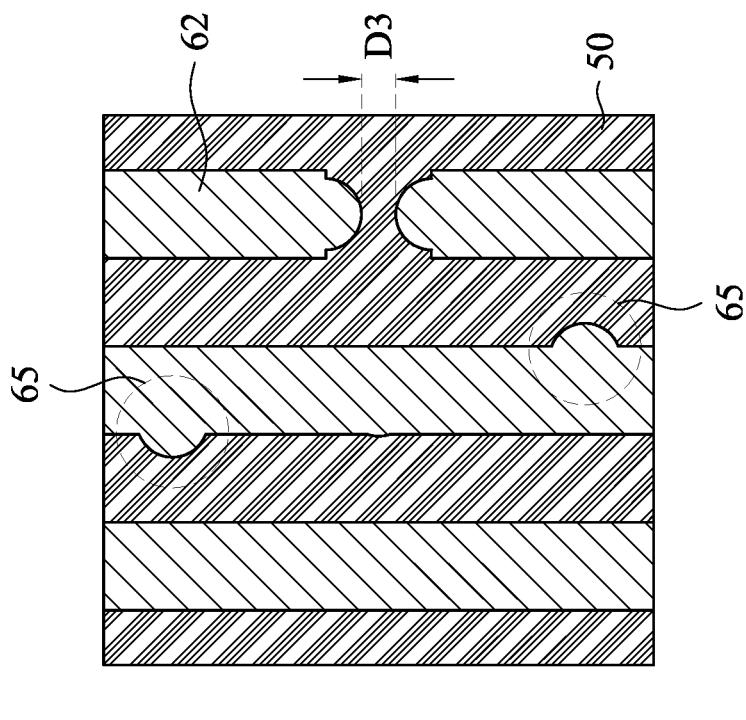
Figure 8E:
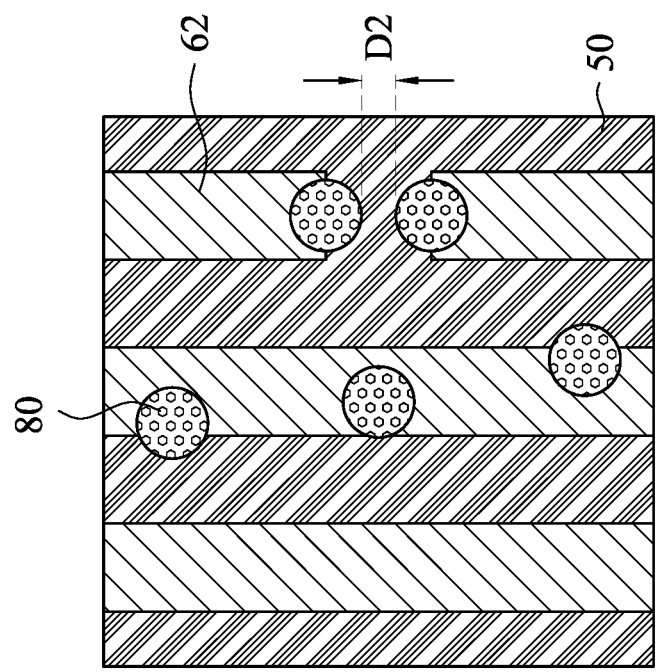
Figure 8G:
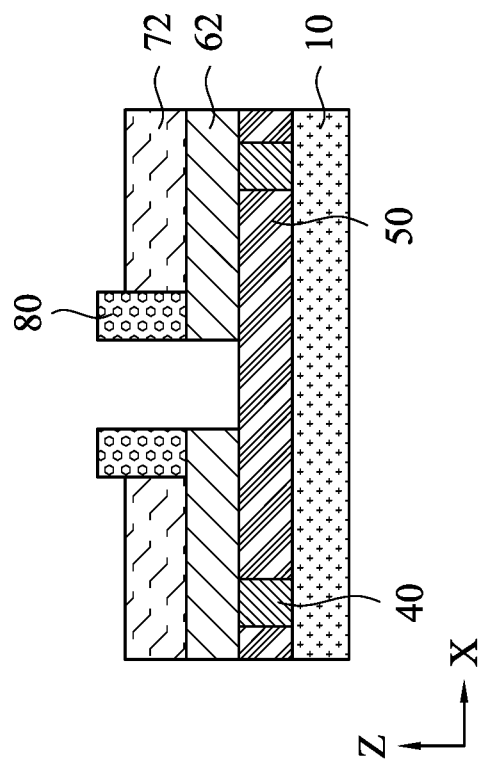

Then, as shown in FIGS. 8A-8D, the hard mask pattern 92 is removed by using a suitable etching operation. FIGS. 8C and 8D are also perspective views from different angles. In some embodiments, a wet etching operation is used to remove the hard mask pattern 92. FIG. 8E show a plan view (a top view) without showing the second ILD layer 72 and FIG. 8F shows a plan view (a top view) without showing the second ILD layer 72 and the vias 80. D3 is an end-to-end space between the wiring patterns. FIG. 8G shows a cross sectional view after the hard mask pattern 92 is removed in case of the structure shown in FIGS. 5D, 6C, and 7C.

As set forth above, the mis-aligned via 80 partially protruding from the side of the hard mask pattern 92 protects the underlying wiring pattern 62 forming a self-aligned structure. In some embodiments, a side face of the wiring pattern 62 includes a protrusion or a bump 65, over which the via 80 is disposed.

Figure 9B:
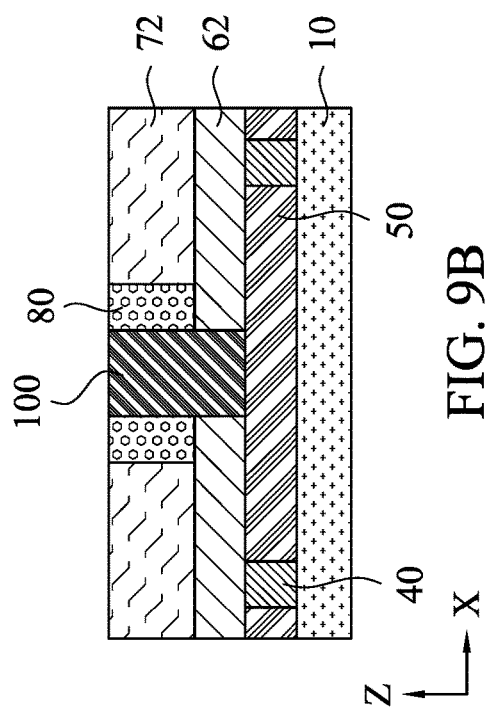
FIGS. 9A, 9B and 9C show views of the various stages of a sequential manufacturing operation of a semiconductor device in accordance with embodiments of the present disclosure.
Figure 9C:
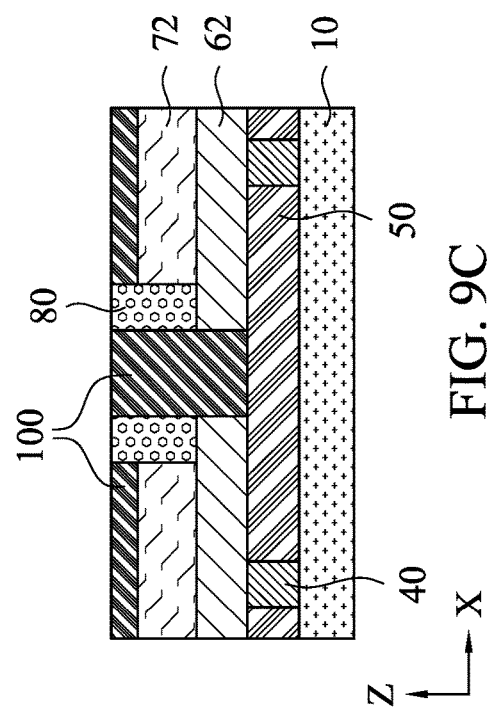
Figure 9A:
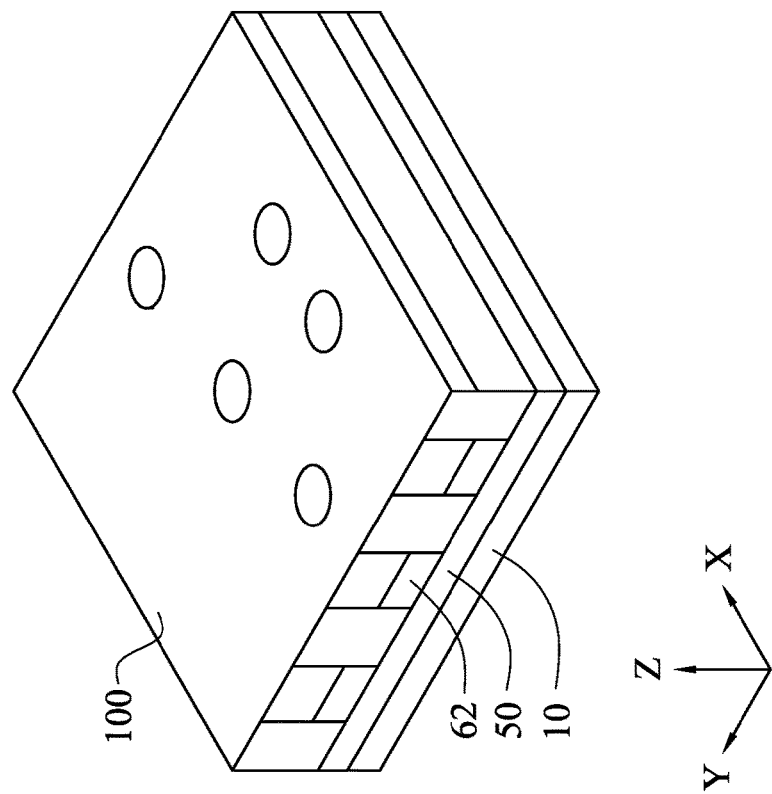

Further, a third ILD layer 100 is formed, as shown in FIGS. 9A and 9B. In some embodiments, a blanket layer of one or more dielectric layers are formed in the trenches between and over the patterned second ILD layers 72 and the wiring patterns 62, and a planarization operation, such as CMP, is performed to expose the upper surface of the vias 80. In some embodiments, the third ILD layer 100 is made of the same material as or different material from the first and/or second ILD layers, and includes one or more layers of silicon oxide, SiON, SiOCN, SiCN, SiOC, silicon nitride, an organic material, a low-k dielectric material, or an extreme low-k dielectric material. As shown in FIGS. 9A and 9B, the wiring patterns $M_x$ and the vias $V_x$ are formed by the operations from FIGS. 2A and 2B to 9A and 9B. FIG. 9C shows a cross sectional view after the third ILD layer 100 is formed in case of the structure shown in FIGS. 5D, 6C, 7C and 8D.

Figure 10B:
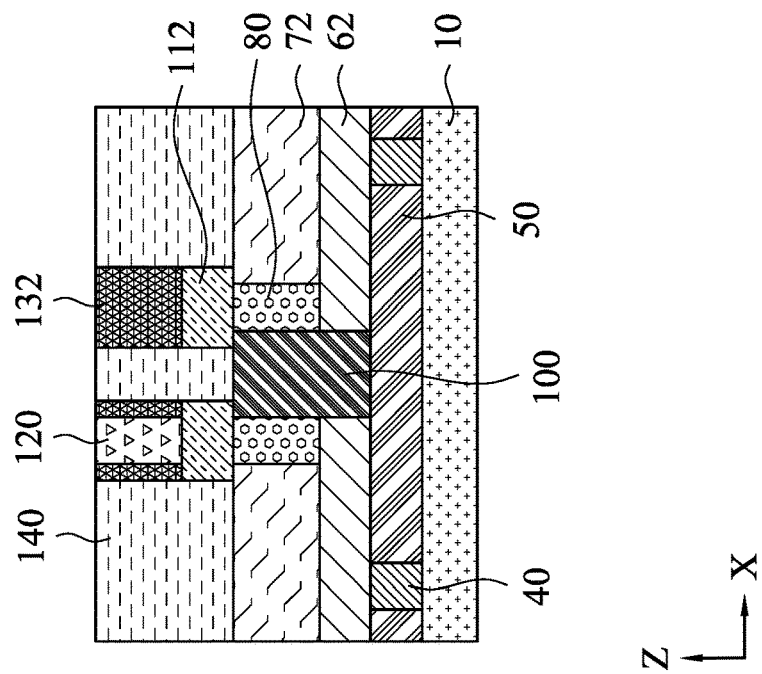
FIGS. 10A, 10B and 10C show views of the various stages of a sequential manufacturing operation of a semiconductor device in accordance with embodiments of the present disclosure.
Figure 10A:
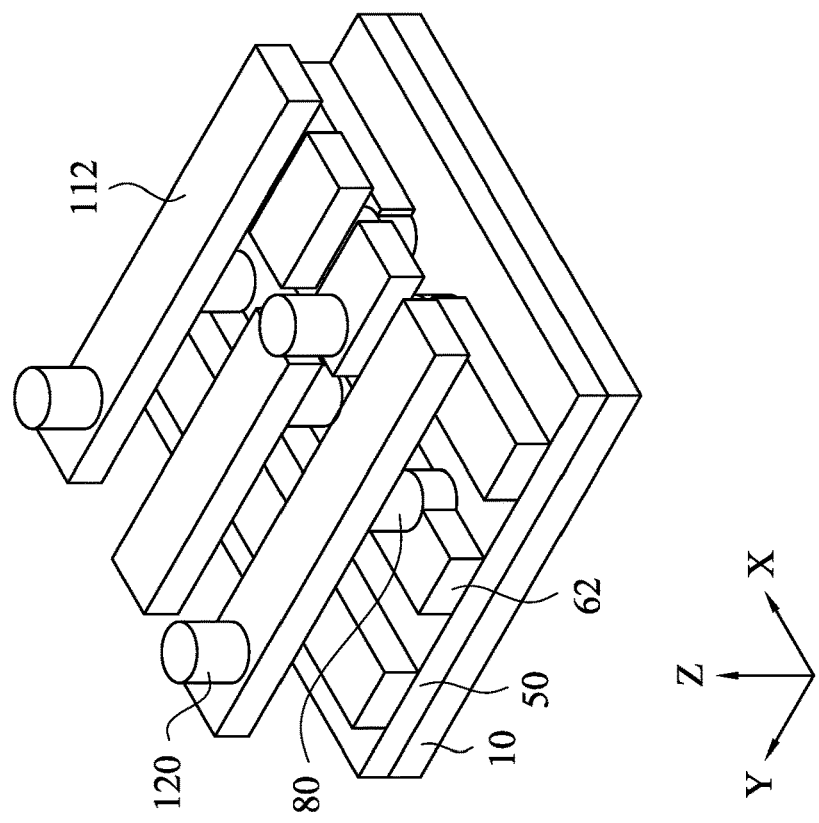
Figure 10C:
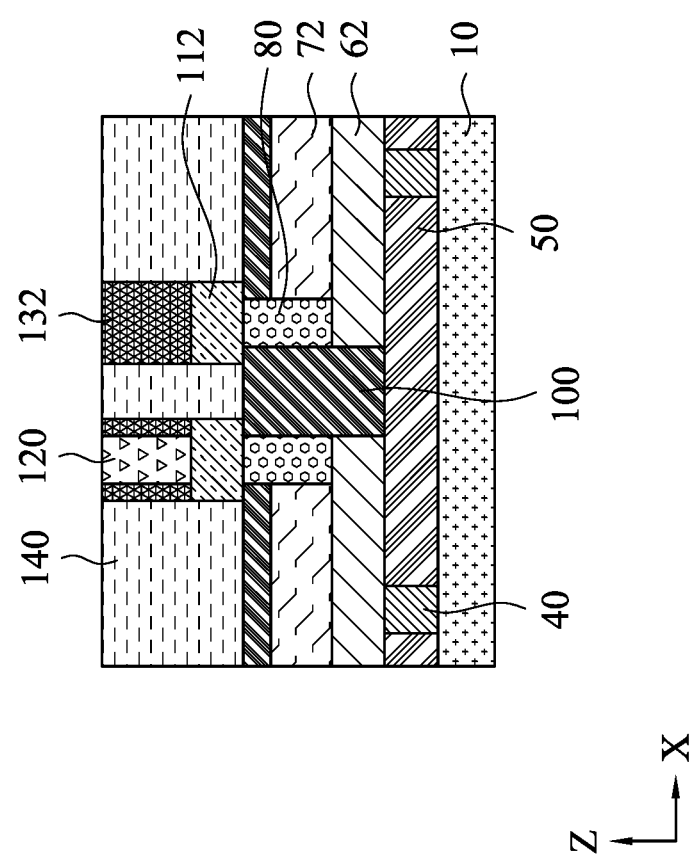

In some embodiments, the operations explained with respect to FIGS. 2A and 2B to 9A and 9B are repeated to form the wiring structure including the wiring patterns $M_{x+1}$ and the vias $V_{x+1}$. FIGS. 10A and 10B shows the structure after the wiring patterns $M_{x+1}$ and the vias $V_{x+1}$ are formed. The wiring patterns $M_{x+1}$ include wiring pattern 112 similar to the wiring pattern 62 and extending to a different direction from the wiring pattern 62 and the vias $V_{x+1}$ includes vias 120 similar to the vias 80 disposed over the wiring patterns 112. In some embodiments, a fourth ILD 132 layer is formed on the wiring patterns 112 and a fifth ILD layer 140 fills the spaces between the patterned fourth ILD layers 132 and the wiring patterns 112. FIG. 10C shows a cross sectional view after the wiring patterns 112, the vias 120, the fourth ILD layer 132, and the fifth ILD layer 140 are formed in case of the structure shown in FIGS. 5D, 6C, 7C, 8D and 9C.

In some embodiments, a width of the wiring pattern 62 is in a range from about 5 nm to about 15 nm with a pitch of about 15 nm to 30 nm depending on the design and/or process requirements. In some embodiments, a diameter of the vias 80 is in a range from about 5 nm to about 15 nm with a minimum pitch of about 12 nm to about 30 nm along the X direction in which the wiring patterns 62 extend and a pitch of about 15 nm to about 30 nm along the Y direction, depending on the design and/or process requirements.

In some embodiment, the diameter of the via 80 is about same as the width of the wiring patterns 62. The difference is more than 0 nm and less than +/−20% of the width of the wiring pattern 62 in some embodiments. In some embodiments, the minimum via pitch of the vias 80 along the Y direction is about the same as the pitch of the wiring patterns 62, and the minimum pitch of the vias along the X direction is about the same as the pitch of the upper wiring patterns 112 ($M_{x+1}$).

Figure 11B:
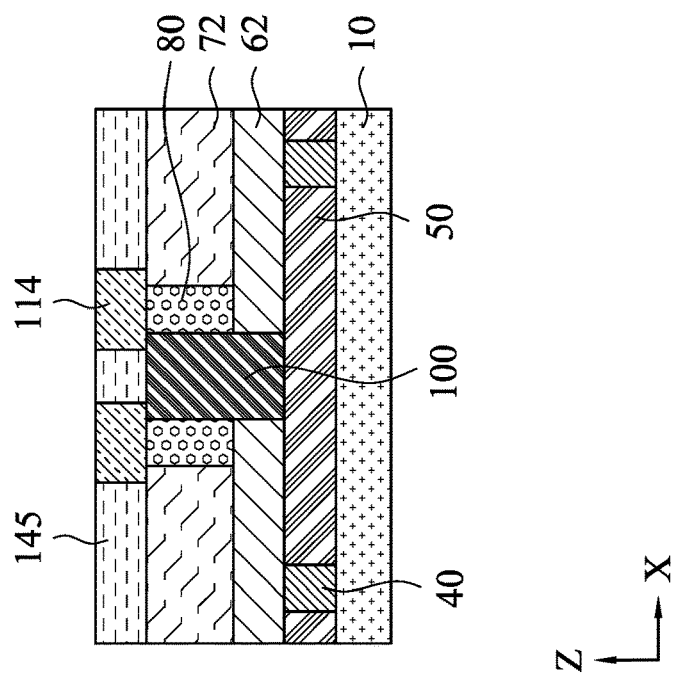
FIGS. 11A and 11B show views of the various stages of a sequential manufacturing operation of a semiconductor device in accordance with embodiments of the present disclosure.
Figure 11A:
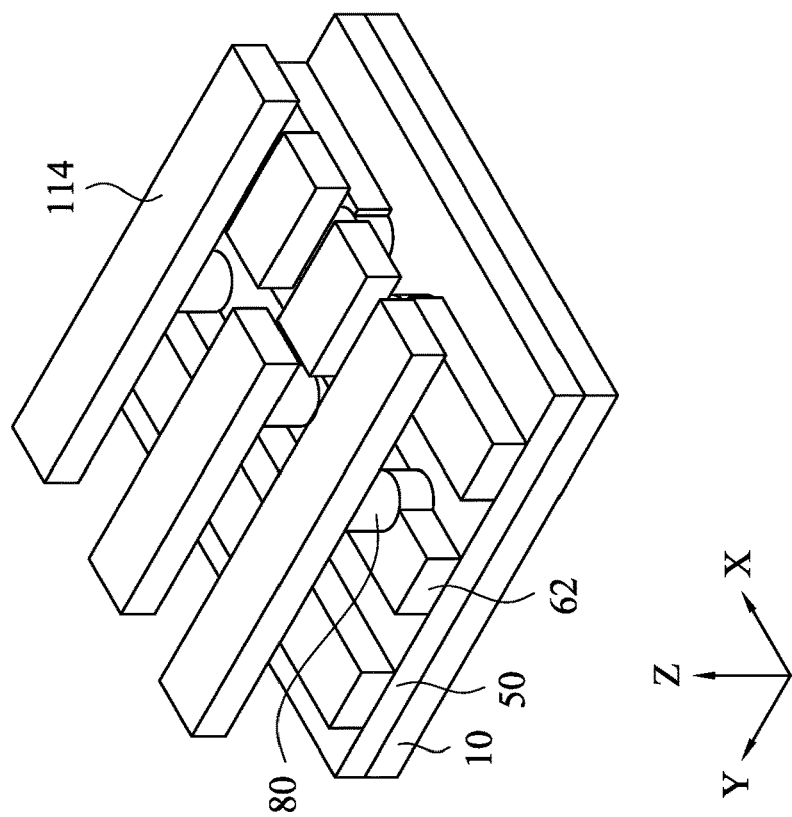

In some embodiments, instead of repeating the operations explained with respect to FIGS. 2A and 2B to 9A and 9B, the wiring pattern 114 for wiring patterns $M_{x+1}$ is formed by a single damascene process as shown in FIGS. 11A and 11B. In some embodiments, the wiring patterns 114 are embedded in trenches formed in an ILD layer 145.

FIGS. 12A to 12D show various views of the various stages of a sequential manufacturing operation in accordance with embodiments of the present disclosure. It is understood that additional operations can be provided before, during, and after processes shown by FIGS. 12A-12D, and some of the operations described below can be replaced or eliminated, for additional embodiments of the method. The order of the operations/processes may be interchangeable.

Figure 12A:
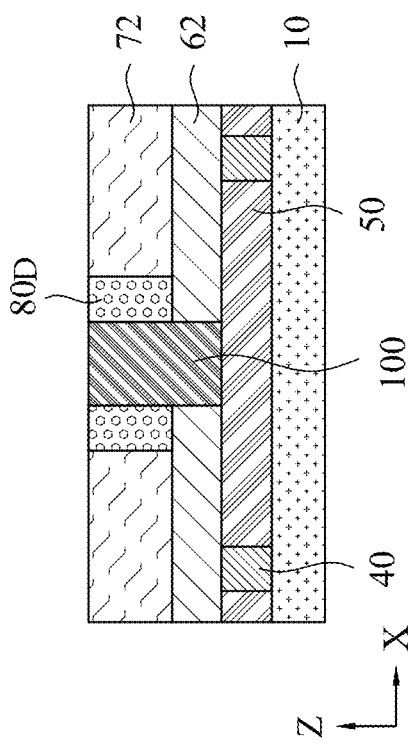
FIGS. 12A, 12B, 12C and 12D show views of the various stages of a sequential manufacturing operation of a semiconductor device in accordance with embodiments of the present disclosure.
Figure 12B:
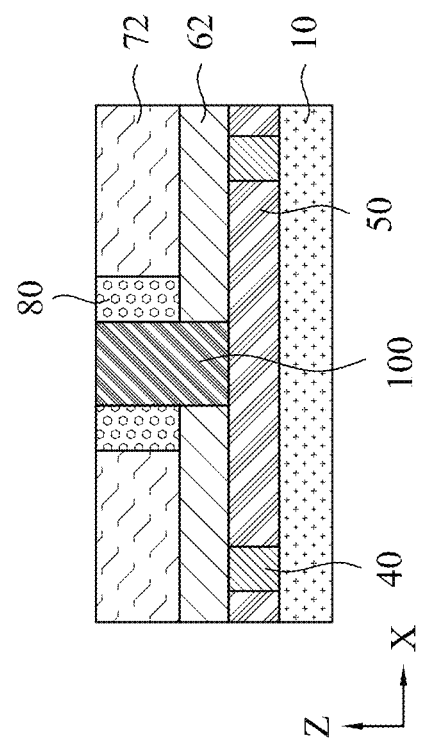
Figure 12C:
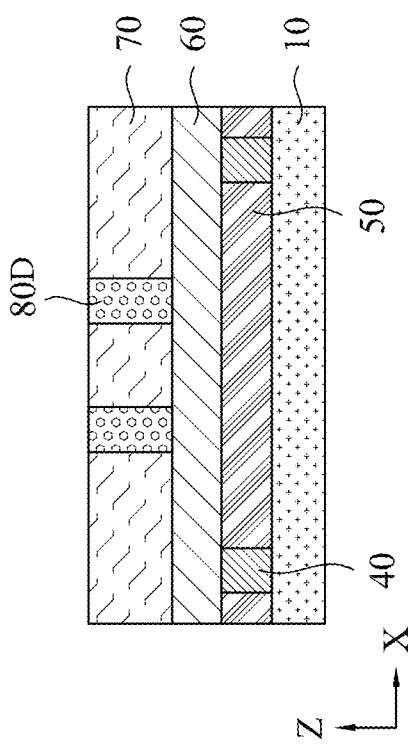
Figure 12D:
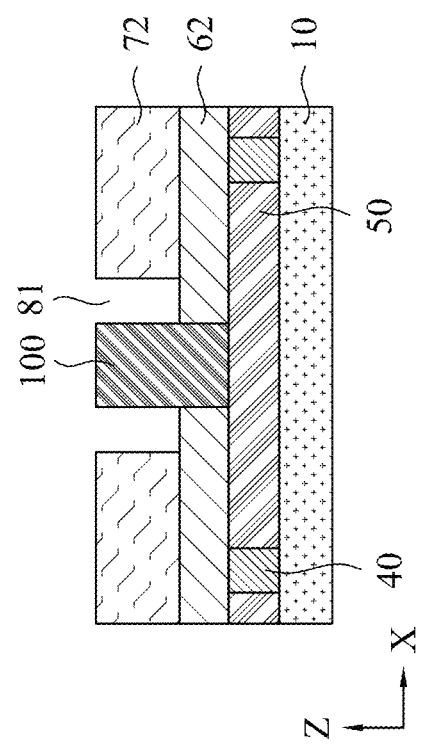

In some embodiments, as shown in FIG. 12A, dummy vias 80D are formed in the second ILD layer 70. In some embodiments, a dielectric material different from the second ILD layer 70 or a semiconductor material is used for the dummy vias 80D. In some embodiments, amorphous or poly silicon is used as the dummy vias 80D. Then, by the operations explained with respect to FIGS. 4A-9B, the patterned second ILD layer 72 and the wiring patterns 62 are formed similar to FIGS. 9A and 9B, as shown in FIG. 12B. Subsequently, the dummy vias 80D are removed to leave holes 81 as shown in FIG. 12C. In some embodiments, when the dummy vias 80D are made of silicon, the dummy vias 80D can be removed by a wet etching operation using, for example, tetramethylammonium hydroxide (TMAH). Then, the holes 81 are filled with one or more conductive materials to form the vias 80 as shown in FIG. 12D.

Figure 13A:
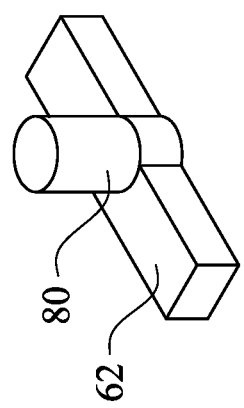
FIGS. 13A, 13B, 13C, 13D, 13E and 13F show views of connection structures of the via and wiring pattern of a semiconductor device in accordance with embodiments of the present disclosure.
Figure 13B:
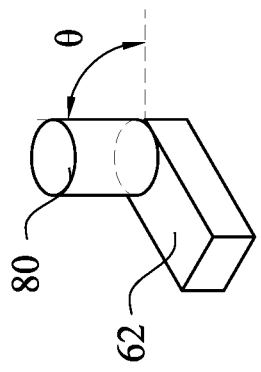

FIGS. 13A and 13B show a detailed view of the via 80 and the wiring pattern 62 according to an embodiment of the present disclosure. In some embodiments, the via 80 has a substantially columnar (cylindrical) shape. In some embodiments, the angle θ between the sidewall of the via 80 and the upper surface of the wiring pattern 62 is in a range from about 89 degrees to about 91 degrees. In some embodiments, the area and/or shape of the upper face of the via 80 is substantially the same as the area and/or shape of the bottom of the via 80. The difference in area between the upper face and the bottom of the via 80 is about 1-5% of the upper surface. As shown in FIGS. 13A and 13B, the wiring pattern 62 below the via 80 may be confined or defined by the largest portion of the via 80 in some embodiments.

Figure 13C:
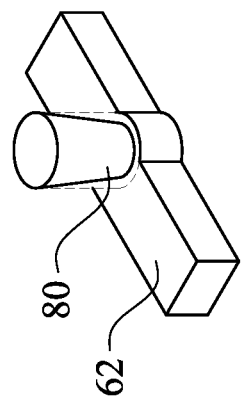
Figure 13D:
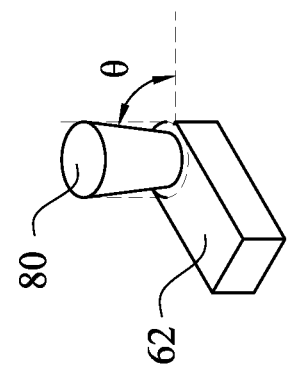

FIGS. 13C and 13D show a detailed view of the via 80 and the wiring pattern 62 according to an embodiment of the present disclosure. In some embodiments, the via 80 has a reverse tapered columnar shape. In some embodiments, the angle θ between the sidewall of the via 80 and the upper surface of the wiring pattern 62 is in a range from about 80 degrees to about 89 degrees and is in a range from about 82 degrees to about 87 degrees in other embodiments. In some embodiments, the area of the upper face of the via 80 is greater than the area of the bottom of the via 80. The difference in area between the upper face and the bottom of the via 80 is about 1-20% of the upper surface. As shown in FIGS. 13C and 13D, the wiring pattern 62 below the via 80 may be confined or defined by the largest portion (the upper portion) of the via 80 in some embodiments.

Figure 13E:
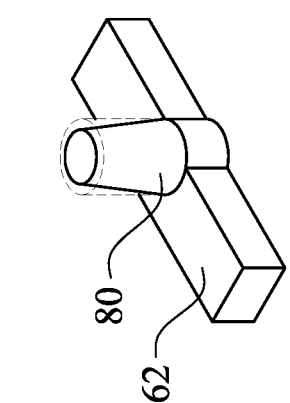
Figure 13F:
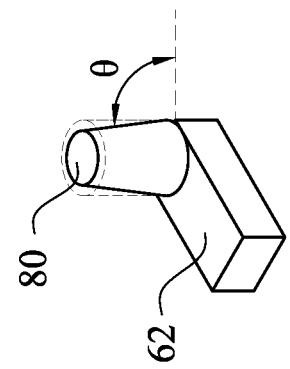

FIGS. 13E and 13F show a detailed view of the via 80 and the wiring pattern 62 according to an embodiment of the present disclosure. In some embodiments, the via 80 has a tapered columnar shape. In some embodiments, the angle θ between the sidewall of the via 80 and the upper surface of the wiring pattern 62 is in a range from about 91 degrees to about 100 degrees and is in a range from about 93 degrees to about 97 degrees in other embodiments. In some embodiments, the area of the upper face of the via 80 is smaller than the area of the bottom of the via 80. The difference in area between the upper face and the bottom of the via 80 is about 1-20% of the upper surface. As shown in FIGS. 13E and 13F, the wiring pattern 62 below the via 80 may be confined or defined by the largest portion (the bottom) of the via 80 in some embodiments.

The different shapes of the vias 80 depend on the etching results for forming holes in the first ILD layer in the single damascene process as explained with respect to FIGS. 3A and 3B.

FIGS. 14A-14D show plan views (top views) of the vias 80 and the hard mask pattern 92 and FIGS. 15A-15D show plan views (top views) of the corresponding wiring pattern 62, according to embodiments to the present disclosure. As shown in FIGS. 14A-15D, the wiring patterns 62 have the same shape of the combination (as a logical sum) of the hard mask pattern 92 and the vias 80 in plan view.

When a single or dual damascene process is used a certain via enclosure budget for CD and overlay error is needed. In some embodiments, the via enclosure budget may be estimated as EB=(D2−D1)/2, where D2 is an end-to-end space between adjacent vias 80, and D1 is an end-to-end space between two patterns of the hard mask pattern 92 along the X direction. In the damascene process, EB is more than 0 nm.

Figure 14A:
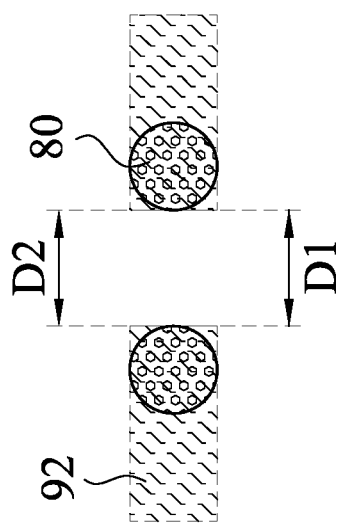
FIGS. 14A, 14B, 14C and 14D show plan views of a hard mask pattern and vias in accordance with embodiments of the present disclosure.
Figure 14B:
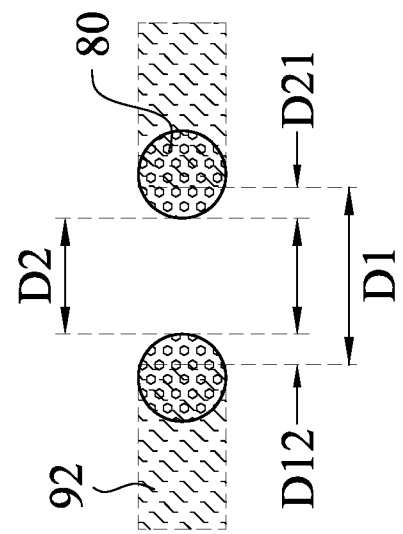
Figure 14C:
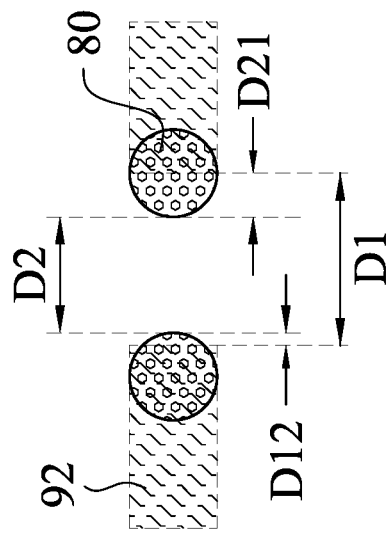

In some embodiments of the present disclosure, as shown in FIG. 14A, the EB is zero or can be negative as shown in FIG. 14B. In some embodiments, a left margin D12 of the EB is the same as a right margin D21 of the EB as shown in FIG. 14B. In other embodiments, D12 is different (smaller or greater) than D21 due to an overlay error between the vias 80 and the hard mask pattern 92, as shown in FIG. 14C. As shown in FIGS. 14A-14C, the end-to-end space D1 can be expanded or greater than the end-to-end space D2 of the vias, and the patterning in the lithography operation for the hard mask pattern 92 (e.g., pattern margins in the layout) can have a greater tolerance.

Figure 14D:
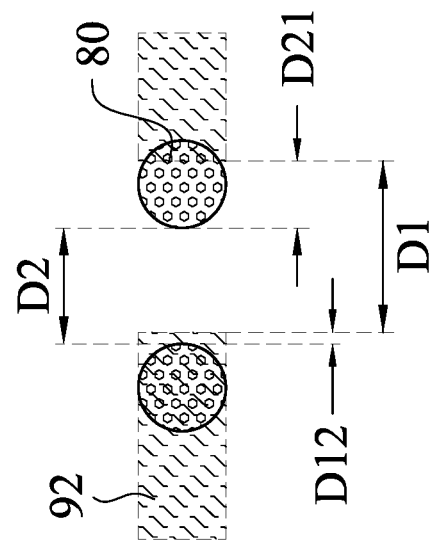
Figure 15A:
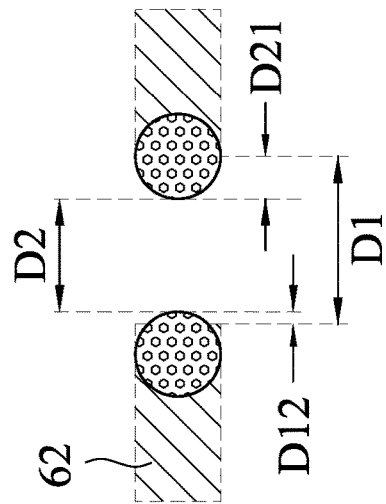
FIGS. 15A, 15B, 15C and 15D show plan views of wiring patterns and vias in accordance with embodiments of the present disclosure.
Figure 15B:
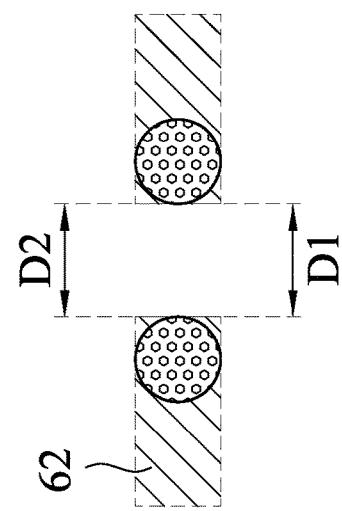
Figure 15C:
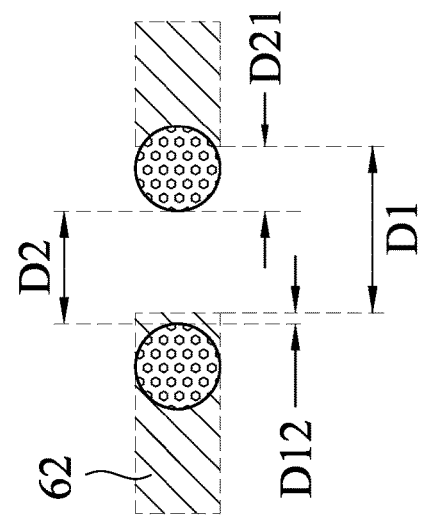
Figure 15D:
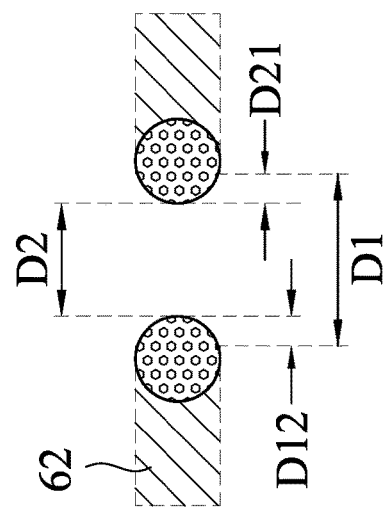

In some embodiments, as shown in FIG. 14D, the overlay error between the vias 80 and the hard mask pattern 92 is larger than the case of FIG. 14C. In some embodiments, the end of one of the hard mask patterns overhangs one of the vias 80. In such a case, the wiring patterns 62 also have the same shape of the combination (the logical sum) of the hard mask pattern 92 and the vias 80.

FIGS. 16A to 16H show various views of the various stages of a sequential manufacturing operation of forming the vias 80 in accordance with embodiments of the present disclosure. It is understood that additional operations can be provided before, during, and after processes shown by FIGS. 16A-16H, and some of the operations described below can be replaced or eliminated, for additional embodiments of the method. The order of the operations/processes may be interchangeable.

Figure 16A:
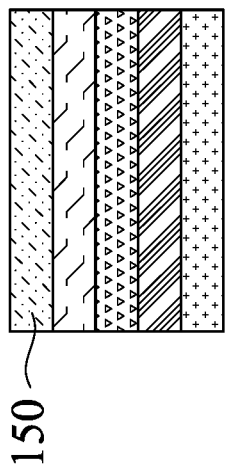
FIGS. 16A, 16B, 16C, 16D, 16E, 16F, 16G and 16H show views of the various stages of a sequential manufacturing operation of a semiconductor device in accordance with embodiments of the present disclosure.
Figure 16B:
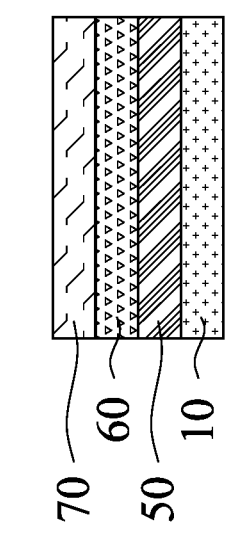
Figure 16C:
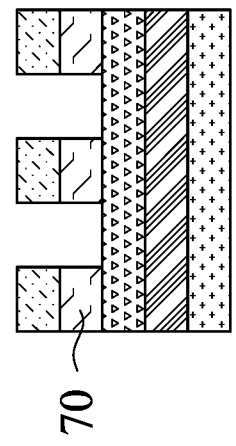
Figure 16D:
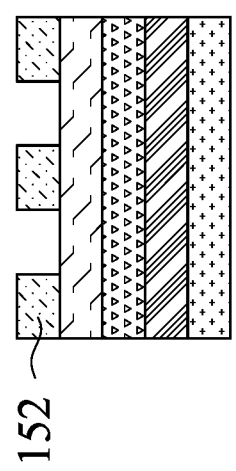
Figure 16F:
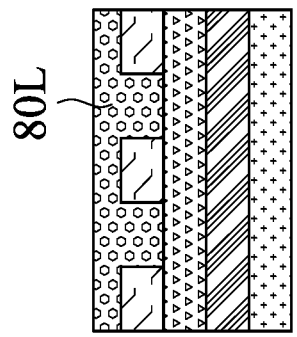
Figure 16H:
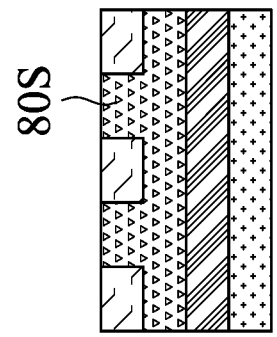
Figure 16E:
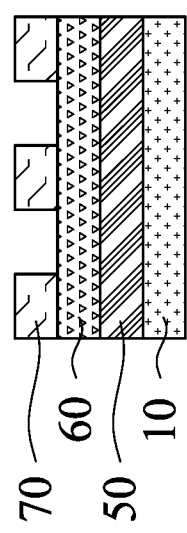
Figure 16G:
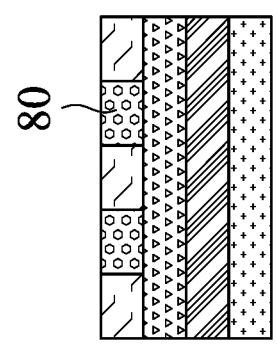

In the process shown by FIGS. 16A-16H is substantially the same as a single damascene process. As shown in FIG. 16A, the second ILD layer 70 is formed over the first conductive layer 60. Then, in some embodiments, a resist layer, for example, a photo resist layer 150 is formed over the second ILD layer 70 as shown in FIG. 16B, and then using a lithography operation, the resist layer is patterned into a resist pattern 152 having holes corresponding to the vias 80 as shown in FIG. 16C. Then, the second ILD layer 70 is patterned by using plasma etching to form holes in the second ILD layer 70 as shown in FIG. 16D. Then, the resist pattern 152 is removed as shown in FIG. 16E. Then, one or more conductive layers 80L are formed in the holes (a filling process) and the upper surface of the second ILD layer 70, as shown in FIG. 16F, and one or more planarization operation, such as a CMP process, is performed to remove excess portions of the conductive layers-, thereby forming vias 80 as shown in FIG. 16G. In some embodiments, the vias 80S and the first conductive layer 60 are made of the same material as shown in FIG. 16H, and there is no significant interface between the vias 80S and the first conductive layer 60.

FIGS. 17A to 17E show various views of the various stages of a sequential manufacturing operation of forming the vias 80 in accordance with embodiments of the present disclosure. It is understood that additional operations can be provided before, during, and after processes shown by FIGS. 17A-17E, and some of the operations described below can be replaced or eliminated, for additional embodiments of the method. The order of the operations/processes may be interchangeable.

In some embodiments, after the vias 80 are formed as shown in FIG. 17A (the same as FIG. 16G), an upper portion of the vias 80 is partially recessed as shown in FIG. 17B. In some embodiments, the recessing amount (depth) is in a range from about 1 nm to about 20 nm. In other embodiments, the recessing amount is about 5% to 30% of the total thickness of the vias 80. Then, one or more conductive layers 160L are formed over the recessed vias 80R and the upper surface of the second ILD layer 70, as shown in FIG. 17C, and one or more planarization operations, such as CMP process, is performed to remove excess portions of the conductive layers, thereby forming a cap conductive layer 160 as shown in FIG. 17D. In some embodiments, the vias 80S and the first conductive layer 60 are made of the same material as shown in FIG. 17E, and there is no significant interface between the vias 80S and the first conductive layer 60. When the thickness of the cap conductive layer 160 is too large, a resistance of the vias increases and then the thickness of the cap conductive layer 160 is too small, a functionality of the cap conductive layer 160 (e.g., etching barrier) may be reduced. In some embodiments, the cap conductive layer 160 includes one or more metal or metal nitride layers, such as a Ta, a Ti, a TaN or a TiN layer. In some embodiments, TiN is used. In some embodiments, the conductive layer 160L is formed by CVD, PVD, plating or ALD.

The operations explained with respect to FIGS. 16E-16H and/or FIGS. 17A-17E can be applied to form the vias 80 in the holes 81 after the dummy vias 80D are removed as shown in FIG. 12C.

Figure 18A:
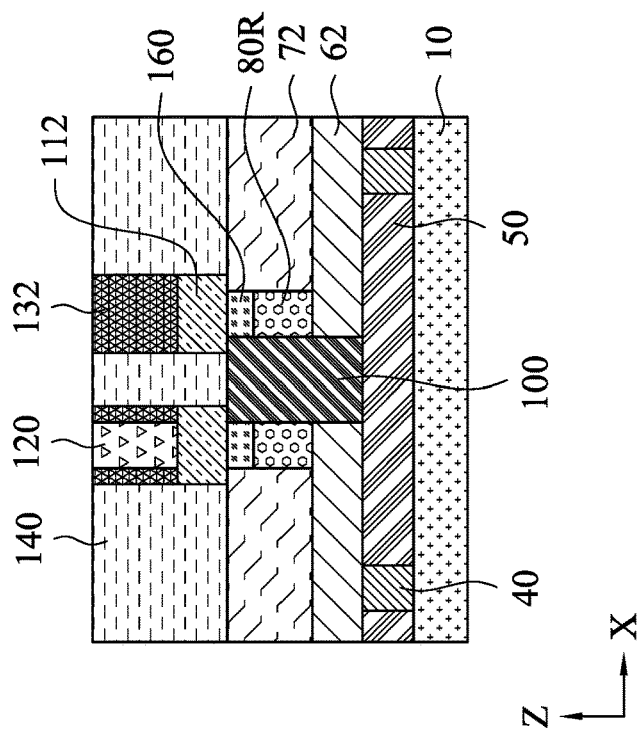
FIGS. 18A and 18B show wiring structures of a semiconductor device in accordance with embodiments of the present disclosure.
Figure 18B:
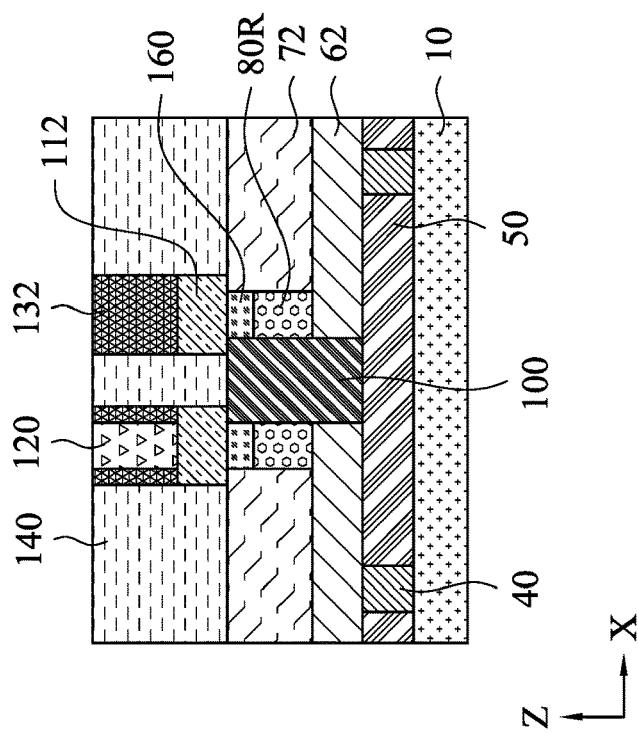

FIGS. 18A and 18B show cross sectional views of the wiring structure after the upper wiring layers are formed similar to FIGS. 10A and 10B, with a cap conductive layer 160 over the vias 80R in accordance with embodiments of the present disclosure. In some embodiments, as shown in FIG. 18A, the upper wiring pattern 112 is aligned with the vias 80R with the cap conductive layer 160 and thus the upper wiring pattern 112 fully covers the cap conductive layer 160. In other embodiments, the upper wiring patterns 112 are mis-aligned with the vias 80R with the cap conductive layer 160 and a part of the cap conductive layer 160 is exposed from the wiring pattern 112. In such a case, when the material of the cap conductive layer 160 and the material of the hard mask pattern used to form the upper wiring structures are the same, the etching of the conductive layer for the wiring pattern 112 substantially stops at the cap conductive layer 160. Thus, the cap conductive layer 160 functions as an etching barrier or an etch stop layer. In some embodiments, the cap layer 160 is removed after planarization operation and before the next layer applied on the vias 80R.

In the embodiments of the present disclosure, the wiring pattern is formed (patterned) after a via or a dummy via disposed on the wiring pattern is formed in an interlayer dielectric layer. In such a process, the wiring pattern is confined with the via, and thus even if there is an overlay error between a mask pattern (hard mask pattern and/or resist pattern) and the via, the patterned wiring pattern has a protrusion below the via, which secures the connection between the via and the wiring pattern.

It will be understood that not all advantages have been necessarily discussed herein, no particular advantage is required for all embodiments or examples, and other embodiments or examples may offer different advantages.

In accordance with an aspect of the present disclosure, in a method of manufacturing a semiconductor device, a first conductive layer is formed over a first interlayer dielectric (ILD) layer disposed over a substrate, a second ILD layer is formed over the first conductive layer, a via is formed in the second ILD layer to contact an upper surface of the first conductive layer, a hard mask pattern is formed over the second ILD layer, the second ILD layer and the first conductive layer are patterned by using the hard mask pattern as an etching mask, thereby forming patterned second ILD layers and first wiring patterns, after the patterning, the hard mask pattern is removed, and a third ILD layer is formed between the patterned second ILD layers and the first wiring patterns. In one or more of the foregoing or following embodiments, the first conductive layer includes one of Co, Cu or Ru. In one or more of the foregoing or following embodiments, the via includes one of Co, Cu or Ru. In one or more of the foregoing or following embodiments, the first conductive layer and the via are made of different materials. In one or more of the foregoing or following embodiments, the hard mask pattern is in contact with an upper surface of the via. In one or more of the foregoing or following embodiments, a part of the upper surface of the via is exposed from the hard mask pattern, and the via is also used as the etching mask. In one or more of the foregoing or following embodiments, the hard mask pattern includes TiN. In one or more of the foregoing or following embodiments, the first ILD layer comprises a lower via, and the hard mask pattern includes a pattern aligned with the lower via. In one or more of the foregoing or following embodiments, the via includes a body part and a cap layer disposed on the body part made of a different material than the body part. In one or more of the foregoing or following embodiments, the hard mask pattern is made of a same material as the cap layer.

In accordance with another aspect of the present disclosure, in a method of manufacturing a semiconductor device, a first conductive layer is formed over a first interlayer dielectric (ILD) layer disposed over a substrate, a second ILD layer is formed over the first conductive layer, a dummy via is formed in the second ILD layer to contact an upper surface of the first conductive layer, a hard mask pattern is formed over the second ILD layer, the second ILD layer and the first conductive layer are patterned by using the hard mask pattern as an etching mask, thereby forming patterned second ILD layers and first wiring patterns, after the patterning, the hard mask pattern is removed, a third ILD layer is formed between the patterned second ILD layers and the first wiring patterns, and the dummy via is replaced with a conductive via. In one or more of the foregoing or following embodiments, the dummy via includes a different material than the second ILD layer and the first conductive layer. In one or more of the foregoing or following embodiments, the dummy via includes amorphous or poly silicon. In one or more of the foregoing or following embodiments, the dummy via includes a dielectric material. In one or more of the foregoing or following embodiments, the first conductive layer and the conductive via are made of a same material. In one or more of the foregoing or following embodiments, a second wiring pattern is further formed over the conductive via.

In accordance with another aspect of the present disclosure, in a method of manufacturing a semiconductor device, the semiconductor device includes a lower wiring pattern, an upper wiring pattern and a via connecting the lower wiring pattern and the upper wiring pattern. In the method, the via is formed in a dielectric layer, and after the via is formed, the lower wiring pattern disposed below the via is formed. In one or more of the foregoing or following embodiments, wherein when the lower wiring pattern is formed, a blanket layer of a conductive material is formed before the dielectric layer is formed, and the blanket layer is patterned by a plasma dry etching. In one or more of the foregoing or following embodiments, the blanket layer is patterned by using a hard mask pattern disposed over the dielectric layer. In one or more of the foregoing or following embodiments, the hard mask pattern is formed by using a damascene process.

In accordance with another aspect of the present disclosure, a semiconductor device includes transistors disposed over a substrate, and a plurality of wiring layers disposed over the transistors. One of the plurality of wiring layers includes a wiring pattern and a via connected to an upper surface of the wiring pattern, and the wiring pattern includes a lateral protrusion protruding from a side face of the wiring pattern. In one or more of the foregoing or following embodiments, a part of the via is disposed on the lateral protrusion. In one or more of the foregoing or following embodiments, the via and the wiring pattern are made of a same material. In one or more of the foregoing or following embodiments, the wiring pattern includes one of Co or Ru. In one or more of the foregoing or following embodiments, the via includes a body layer and a cap layer disposed over the body layer and made of a different material than the body layer. In one or more of the foregoing or following embodiments, the body layer includes at least one of Cu, Al, Ru, W, Co, Ti or Ta, and the cap layer is made of TiN. In one or more of the foregoing or following embodiments, the via has a tapered columnar shape having a top smaller than a bottom. In one or more of the foregoing or following embodiments, an angle between a side face of the via and an upper surface of the wiring pattern is in a range from 91 degrees to 100 degrees. In one or more of the foregoing or following embodiments, the via has a reverse tapered columnar shape having a top larger than a bottom. In one or more of the foregoing or following embodiments, an angle between a side face of the via and an upper surface of the wiring pattern is in a range from 80 degrees to 89 degrees.

In accordance with another aspect of the present disclosure, a semiconductor device includes transistors disposed over a substrate, and a plurality of wiring layers disposed over the transistors. One of the plurality of wiring layers includes a first wiring pattern, a second wiring pattern, a first via connected to an upper surface of the first wiring pattern, and a second via connected to an upper surface of the second wiring pattern. The first and second wiring patterns extend in a first direction and are aligned with each other in the first direction. The first via is disposed at an end of the first wiring pattern and the second via is disposed at an end of the second wiring pattern. An end-to-end space between the first and second vias is equal to an end-to-end space between the first and second wiring patterns in the first direction. In one or more of the foregoing or following embodiments, the end of the first wiring pattern is confined by the first via and the end of the second wiring pattern is confined by the second via. In one or more of the foregoing or following embodiments, the first and second vias are made of a different material than the first and second wiring patterns. In one or more of the foregoing or following embodiments, the via includes a body layer and a cap layer disposed over the body layer and made of a different material than the body layer. In one or more of the foregoing or following embodiments, the body layer includes at least one of Cu, Al, Ru, W, Co, Ti or Ta, and the cap layer is made of TiN.

In accordance with another aspect of the present disclosure, a semiconductor device includes transistors disposed over a substrate, and a plurality of wiring layers disposed over the transistors. The plurality of wiring layers includes an n-th wiring layer and an (n+1)-th wiring layer. The n-th wiring layer includes a first wiring pattern and a first via connected to an upper surface of the first wiring pattern. The (n+1)-th wiring layer includes a second wiring pattern and a second via connected to an upper surface of the second wiring pattern. The first wiring pattern includes a lateral protrusion protruding from a side face of the first wiring pattern below the second via. In one or more of the foregoing or following embodiments, the second via is mis-aligned with the first wiring pattern. In one or more of the foregoing or following embodiments, the second via includes a body layer and a cap layer disposed over the body layer and made of a different material than the body layer. In one or more of the foregoing or following embodiments, the second wiring pattern is mis-aligned with the second via. In one or more of the foregoing or following embodiments, a part of an upper surface of the cap layer is exposed from the second wiring pattern.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device comprising:
    forming a first conductive layer over a first interlayer dielectric (ILD) layer disposed over a substrate;
    forming a second ILD layer over the first conductive layer;
    forming a via in the second ILD layer to contact an upper surface of the first conductive layer;
    forming a hard mask pattern over the second ILD layer;
    transferring the hard mask pattern into the second ILD layer and first conductive layer, thereby forming patterned second ILD layers and patterned first wiring patterns;
    after the patterning, removing the hard mask pattern; and
    forming a third ILD layer between the patterned second ILD layers and the patterned first wiring patterns.

2. The method of claim 1, wherein the hard mask pattern is in contact with an upper surface of the via.

3. The method of claim 2, wherein a part of the upper surface of the via is exposed from the hard mask pattern, and the via is also used as an etching mask.

4. The method of claim 1, wherein the first conductive layer includes one of Co, Cu or Ru.

5. The method of claim 1, wherein the via includes one of Co, Cu or Ru.

6. The method of claim 1, wherein the first conductive layer and the via are made of different materials.

7. The method of claim 1, wherein the hard mask pattern includes TiN.

8. The method of claim 1, wherein:
    the first ILD layer comprises a lower via, and
    the hard mask pattern includes a pattern aligned with the lower via.

9. The method of claim 1, wherein the via includes a body part and a cap layer disposed on the body part made of a different material than the body part.

10. The method of claim 9, wherein the hard mask pattern is made of a same material as the cap layer.

11. A method of manufacturing a semiconductor device comprising a lower wiring pattern, an upper wiring pattern and a pair of vias connecting the lower wiring pattern and the upper wiring pattern, the method comprising:
    forming a conductive layer over a substrate;
    forming a dielectric layer over the conductive layer;
    forming the pair of vias in the dielectric layer;
    forming a hard mask pattern over the dielectric layer;
    forming an opening in the dielectric layer between the pair of vias;
    extending the opening through the conductive layer to form the lower wiring pattern;
    forming a second dielectric layer filling the opening; and
    forming the upper wiring pattern over the pair of vias and the second dielectric layer.

12. The method of claim 11, wherein the lower wiring pattern is formed by:
    a plasma dry etching.

13. The method of claim 12, wherein the hard mask pattern and the pair of vias are used as a mask during the plasma dry etching.

14. The method of claim 13, wherein the hard mask pattern is formed by using a damascene process.

15. A method of manufacturing a semiconductor device comprising:
    forming a first interlayer dielectric (ILD) layer over a substrate;
    forming a first conductive layer over the first interlayer dielectric (ILD) layer;
    forming a second ILD layer over the first conductive layer;
    forming a first via and a second via in the second ILD layer contacting an upper surface of the first conductive layer;
    forming an opening in the second ILD layer between the first via and the second via,
    wherein the opening is bounded by sidewalls of the first via and the second via;
    extending the opening into the first conductive layer exposing a portion of the first ILD layer, thereby patterning the first conductive layer into a first patterned conductive layer and a second patterned conductive layer; and
    forming a third ILD layer between the first patterned conductive layer and the second patterned conductive layer and between the first via and the second via.

16. The method according to claim 15, further comprising forming the third ILD layer over an uppermost surface of the second ILD layer.

17. The method according to claim 16, further comprising planarizing uppermost surfaces of the third ILD layer and the first and second vias.

18. The method according to claim 15, wherein the first conductive layer includes one of Co, Cu or Ru.

19. The method according to claim 15, wherein the first via and the second via include one of Co, Cu or Ru.

20. The method according to claim 15, wherein the first conductive layer and the first and second vias are made of different materials.

\* \* \* \* \*